United States Patent
Mori

(10) Patent No.: US 6,801,823 B2
(45) Date of Patent: Oct. 5, 2004

(54) PHOTOMASK SUPPLY SYSTEM WITH PHOTOMASK PRODUCTION PERIOD SHORTENED

(75) Inventor: Masayoshi Mori, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/259,465

(22) Filed: Sep. 30, 2002

(65) Prior Publication Data

US 2003/0187750 A1 Oct. 2, 2003

(30) Foreign Application Priority Data

Apr. 1, 2002 (JP) ........................................ 2002-098917

(51) Int. Cl.$^7$ .............................................. G06F 19/00
(52) U.S. Cl. ........................... 700/117; 700/96; 700/121; 705/26; 716/19
(58) Field of Search ......................... 700/95–97, 103, 700/104, 117, 121; 702/35, 81, 84; 703/13, 14; 705/26; 716/19; 382/144; 438/14

(56) References Cited

U.S. PATENT DOCUMENTS

| | | | |
|---|---|---|---|
| 5,933,350 A | * | 8/1999 | Fujimoto et al. ............ 700/121 |
| 6,622,295 B1 | * | 9/2003 | Schepp et al. ................. 716/19 |
| 2002/0143424 A1 | * | 10/2002 | Mori et al. ................... 700/121 |
| 2002/0143650 A1 | * | 10/2002 | Matsuda ........................ 705/26 |
| 2002/0161665 A1 | * | 10/2002 | Aoyama et al. .............. 705/26 |
| 2003/0177469 A1 | * | 9/2003 | Suttile et al. ................. 716/21 |

FOREIGN PATENT DOCUMENTS

| | | |
|---|---|---|
| JP | 58-193405 | 11/1983 |
| JP | 03-39603 | 2/1991 |
| JP | 05-18903 | 1/1993 |
| JP | 06-318773 | 11/1994 |

* cited by examiner

Primary Examiner—Paul Rodriguez
(74) Attorney, Agent, or Firm—McDermott Will & Emery LLP

(57) ABSTRACT

Specification data including a method of measuring the dimension and mask design data for a photomask pattern is transmitted from an order-sender computer via a communication line. An element dimension calculating unit generates a measurement recipe according to the dimension-measurement method and the mask design data to transmit the measurement recipe to an element dimension measuring unit. The element dimension calculating unit calculates production error data of the pattern according to measurement data and the mask design data to transmit the error data to the order-sender via the communication line.

6 Claims, 30 Drawing Sheets

FIG.4 REGISTER OF ORDER-RELATED INFORMATION IN DATABASE

FIG.8

| HEADER | STANDARD PRICE | TOLERANCE (nm) | MEASUREMENT METHOD | NUMBER OF PATTERNS TO BE MEASURED | MINIMUM DIMENSION(nm) |
|---|---|---|---|---|---|
| | 80,000 | ±50 | ACTUAL MEASUREMENT OF ALL POINTS | ~49 | 800 |
| | 100,000 | ±50 | ACTUAL MEASUREMENT OF ALL POINTS | 50~100 | 800 |
| | 56,000 | ±50 | ALL-POINT MEASUREMENT (MEASUREMENT OF REPRESENTATIVE POINTS + SIMULATION) | ~49 | 800 |
| | 70,000 | ±50 | ALL-POINT MEASUREMENT (MEASUREMENT OF REPRESENTATIVE POINTS + SIMULATION) | 50~100 | 800 |
| | 20,000 | ±50 | ALL-POINT SIMULATION | ~49 | 800 |
| | 20,000 | ±50 | ALL-POINT SIMULATION | 50~100 | 800 |
| | ⋮ | ⋮ | ⋮ | ⋮ | ⋮ |

FIG.18

| ESTIMATE DATA | ELEMENT DIMENSION CALCULATING UNIT (→ORDER-RECEIVER COMPUTER (FILTERING))→ORDER-RECEIVER COMPUTER | | | | |
|---|---|---|---|---|---|
| STANDARD PRICE | TOLERANCE | MEASUREMENT METHOD | NUMBER OF PATTERNS TO BE MEASURED | PATTERN DESIGN MINIMUM DIMENSION | ... |
|  |  |  |  |  |  |
|  |  |  |  |  |  |

FIG.19

| MEASUREMENT METHOD DATA | | | | | |
|---|---|---|---|---|---|
| PRODUCT NUMBER | SUBSTRATE SIZE | LIGHT-SHIELDING FILM | TOLERANCE | MEASUREMENT METHOD | DATA FILE NAME | ... |
| | | | | | | |
| | | | | | | |
| | | | | | | |

FIG.21

MEASUREMENT RECIPE DATA

| PRODUCT NUMBER | PATTERN NUMBER OF PATTERN TO BE MEASURED | CLASS OF PATTERN | POSITION OF PATTERN | SHAPE OF PATTERN | DESIGN DIMENSION OF PATTERN | TONE OF PATTERN |
|---|---|---|---|---|---|---|
| | | | | | | |
| | | | | | | |

| MEASUREMENT RANGE | MEASUREMENT FIELD | SAMPLE POSITION | FOCUS POSITION | NUMBER OF REPEATED MEASUREMENTS | MEASUREMENT SCALE | ... |
|---|---|---|---|---|---|---|
| | | | | | | |
| | | | | | | |

FIG.22

| RESULTANT MEASUREMENT DATA | | | | | | | |
|---|---|---|---|---|---|---|---|
| PRODUCT NUMBER | PATTERN NUMBER OF PATTERN TO BE MEASURED | MEASUREMENT VALUE | | | | | |
| | | MEASUREMENT RANGE | MEASUREMENT FIELD | SAMPLE POSITION | FOCUS POSITION | NUMBER OF REPEATED MEASUREMENTS | MEASUREMENT SCALE |
| | | | | | | | |
| | | | | | | | |
| | | | | | | | |

FIG.23

| PRODUCTION CONDITION DATA | | | | |
|---|---|---|---|---|
| SUBSTRATE SIZE | LIGHT-SHIELDING FILM | RESIST NUMBER | RESIST THICKNESS | NUMBER OF PATTERN-DRAWING UNIT | PATTERN-DRAWING METHOD |
| | | | | | |
| | | | | | |
| | | | | | |

| NUMBER OF DEVELOPING UNIT | DEVELOPMENT RECIPE | NUMBER OF ETCHING UNIT | ETCHING RECIPE | NUMBER OF MEASURING UNIT | MEASUREMENT RANGE | MEASUREMENT FIELD |
|---|---|---|---|---|---|---|
| | | | | | | |
| | | | | | | |
| | | | | | | |

| FOCUS POSITION | MEASUREMENT SCALE | SAMPLE POSITION | NUMBER OF REPEATED MEASUREMENTS | POSITION OF PATTERN | SHAPE OF PATTERN | DESIGN DIMENSION OF PATTERN |
|---|---|---|---|---|---|---|
| | | | | | | |
| | | | | | | |
| | | | | | | |

| TONE OF PATTERN | MEASUREMENT VALUE OF PATTERN | PATTERN MEASUREMENT CORRECTION RECIPE | PATTERN MEASUREMENT CORRECTION FACTOR | PRODUCTION ERROR | CLASS OF PATTERN | ... |
|---|---|---|---|---|---|---|
| | | | | | | |
| | | | | | | |
| | | | | | | |

FIG.24

PRODUCTION ERROR DATA    ELEMENT DIMENSION CALCULATING UNIT → ORDER-SENDER COMPUTER

| PRODUCT NUMBER | PATTERN NUMBER OF PATTERN TO BE MEASURED | CLASS OF PATTERN | POSITION OF PATTERN | DESIGN DIMENSION OF PATTERN | TONE OF PATTERN |
|---|---|---|---|---|---|
|  |  |  |  |  |  |
|  |  |  |  |  |  |

| TOLERANCE | NAME OF MEASURING UNIT | MEASUREMENT METHOD | MEASUREMENT | MEASUREMENT AFTER CORRECTION | PRODUCTION ERROR | ... |
|---|---|---|---|---|---|---|
|  |  |  |  |  |  |  |
|  |  |  |  |  |  |  |

LENGTH OF EFFECTIVE WINDOW LA

LENGTH OF EFFECTIVE WINDOW LB

PHOTOMASK SUPPLY SYSTEM WITH PHOTOMASK PRODUCTION PERIOD SHORTENED

BACKGROUND OF THE INVENTION

1. Field of the Invention

The present invention relates to a system of ordering and supplying masks to be used in the process of manufacturing semiconductor devices. In particular, the present invention relates to a system of supplying photomasks to be used as plates for photolithography in the process of manufacturing semiconductor devices.

2. Description of the Background Art

A photomask constituted of a synthetic quartz substrate covered with shielding patterns formed of a thin metal film has been produced for use as a plate for a photolithography step which is one of the steps for manufacturing such a semiconductor integrated circuit device as IC (integrated circuit) chip.

The photomask is produced by a certain mask manufacturer. Information about the specification of the photomask is sent by being recorded on a magnetic tape for example or transmitted online from an IC chip manufacturer (order-sender) to the mask manufacturer (order-receiver). Then, the mask manufacturer prepares production data for producing the photomask according to the supplied information about the specification. With regard to information about details of the order such as the number of ordered photomasks and the delivery date, the IC chip manufacturer (order-sender) notifies the mask manufacturer (order-receiver) by telephone or online. In accordance with the information about order details, the mask manufacturer prepares control data including information necessary for quality control as well as information necessary for production control such as the product number, the number of products to be manufactured, the destination of delivery and the delivery date for example. The prepared control data is passed to a photomask production line. Following the production data prepared according to the specification and the control data prepared according to the information about order details, photomasks are produced on the photomask production line. The photomasks are produced by means of an electron beam exposure machine controlled by the production data for example.

FIG. 30 shows a reticle 8000 for an optical stepper as one example of photomasks as described above. Reticle 8000 constituted of a synthetic quartz substrate has one side on which circuit patterns 8010 and 8020 formed of a thin metal film are provided as a set of shielding patterns.

Actually, circuit patterns 8010 and 8020 each have a set of many patterns with the line-width of the order ranging from a few microns or submicrons to 0.1 micron, for example, which is not shown in FIG. 30.

In manufacturing photomasks, the mask manufacturer should measure and evaluate the production error, i.e., the error (difference) between the design dimension and the finished dimension of an actually produced shielding pattern.

FIGS. 31A and 31B show an element pattern 8100 included in circuit pattern 8010 on the photomask as well as how the dimension of this element pattern 8100 is measured.

In FIG. 31A, this element pattern is rectangular in shape. A measurement window 8200 shown in FIG. 31B is used for measuring the dimension of element pattern 8100.

If the dimension of element pattern 8100 is measured by an SEM (scanning electron microscope), "measurement window" refers to a measuring region which is scanned with an electron beam and a resultant electron beam reflection image is observed to measure the dimension of element pattern 8100.

If element pattern 8100 is measured by a laser microscope, "measurement window" refers to a measuring region to which a laser beam is directed and a resultant optical image is observed to measure the dimension of element pattern 8100.

Thus, a larger "measurement window" provides a greater amount of measurement data which improves the accuracy of the measured dimension.

Regardless of the measurement by means of the electron beam reflection image and the optical image, the observed image in measurement window 8200 is provided as electronic data to a computer and the data of the observed image is image-processed to detect edge parts 8220 and 8210 of element pattern 8100 and measure the dimension thereof. For example, the second derivative of the intensity of the electron beam reflection image may be determined to detect the point of inflection of the reflection intensity and detect the edges from point of inflection.

In this way, the dimension is measured to evaluate any production error of photomasks.

However, if the mask manufacturer is required to evaluate the production error measured as described above and then deliver products to the IC chip manufacturer with the error guaranteed by the mask manufacturer and accordingly required to measure all dimensions of circuit patterns 8010 and 8020, a resultant problem is that the delivery date (turnaround time: TAT) is extended and the production cost increases.

The mask pattern is produced based on design data prepared as digital data. Accordingly, the outline of each pattern is represented, for example, by a set of coordinates on a so-called "design grid" consisting of units formed by parallel bars and crossbars, one unit corresponding to the minimum design unit. Such a "design grid" is also called "address unit" for specifying positions where patterns are to be formed in producing a mask.

Each pattern on the photomask being produced is not necessarily formed of outer lines that are parallel with the bars or crossbars of the grid of "address unit" described above. For example, the pattern could have an outer line diagonal to the bars or crossbars or curved outline depending on cases.

For example, an interconnection diagonal to any bar of the design grid at an angle of 45° may be formed or a pattern of an element for which a high withstand voltage is required may be designed to have a circular outline.

In this case, the design data used for producing the mask is actually represented as a set of coordinates on a grid having values rounded by "address unit."

In such a case, the production error between the designed pattern and any shielding pattern on the photomask is affected by round-off error. Therefore, it could be difficult to accurately evaluate manufacturing tolerance as an error between the dimension of the designed pattern and the finished dimension of the shielding pattern.

Moreover, even if outer lines of each pattern on the photomask are all in parallel with the bars or crossbars of the grid of "address unit," the pattern on the photomask could be complex in shape.

For example, with the decreasing feature size of circuit patterns, it becomes difficult to faithfully form the pattern shape of the mask on a wafer. Then, graphics could be added to the mask pattern or optical proximity correction (OPC) could be applied for correcting the size depending on density of features. In this case, each pattern on the photomask could be complex in shape as described above. A problem here is that accurate evaluation of the pattern dimension is difficult since outer lines of a pattern are not straight lines of a predetermined length in parallel with each other.

SUMMARY OF THE INVENTION

One object of the present invention is to provide a mask supply system to shorten the period for manufacturing photomasks.

Another objet of the present invention is to provide a mask supply system to reduce the manufacturing cost of photomasks.

In summary, the present invention is a photomask supply system supplying a photomask to an order-sender. The photomask supply system includes a communication unit, a storage unit, a measuring unit, and a control unit.

The communication unit communicates with the order-sender. The storage unit stores data. The measuring unit measures, according to a measurement recipe, the dimension of a pattern on the photomask which has been produced. The control unit is connected to the communication unit and the storage unit for controlling the communication unit and the storage unit.

The control unit includes a unit for receiving specification data via the communication unit and storing the specification data in the storage unit, the specification data including a dimension-measurement method and mask design data for the pattern formed on the photomask, a recipe generating unit for generating the measurement recipe according to the dimension-measurement method and the mask design data, a calculating unit for calculating to derive, based on the measurement data and the mask design data, production error data for the pattern, and a unit for transmitting the production error data to the order-sender via the communication unit.

Preferably, the control unit further includes a time calculating unit for calculating a measurement time required for measurement performed by the measuring unit based on the specification data, an estimate calculating unit for calculating cost estimate data based on the measurement time, and a transmitting unit for transmitting the cost estimate data to the order-sender via the communication unit.

One advantage of the present invention is thus in reduction of the period for manufacturing photomasks since the production error of the photomask is derived by calculation.

Another advantage of the present invention is in reduction of the manufacturing cost since the time for measurement derived through calculation is used in providing estimate data to the order-sender.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 shows one example of the estimate data generated by following the flow described in connection with FIG. 7.

FIG. 18 shows estimate data from the element dimension calculating unit 100 that is recorded on a fixed disk for example in the order-sender computer.

FIG. 19 conceptually shows measurement method data transmitted to the element dimension calculating unit 100 and then recorded on the fixed disk 124 in the element dimension calculating unit 100.

FIG. 21 conceptually shows a structure of measurement recipe data transmitted from the element dimension calculating unit 100 to the element dimension measuring unit 200.

FIG. 22 conceptually shows a structure of resultant measurement data recorded on the fixed disk 124 in the element dimension calculating unit 100.

FIG. 23 conceptually shows a structure of production condition data recorded on the fixed disk 124 for example in the element dimension calculating unit.

FIG. 24 conceptually shows production error data recorded on the fixed disk for example of the order-sender computer.

DESCRIPTION OF THE PREFERRED EMBODIMENTS

Figure 1:
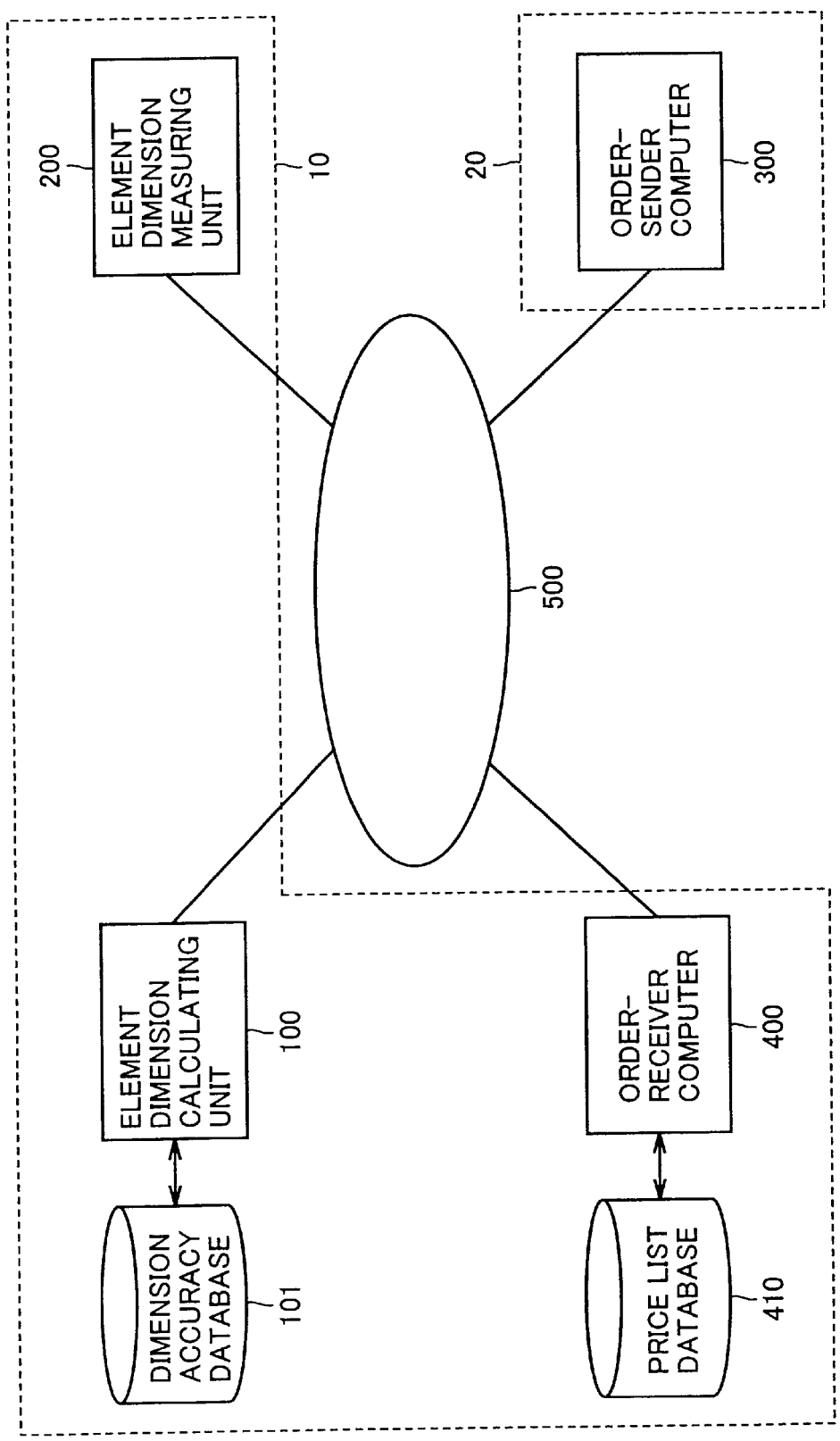
FIG. 1 is a block diagram schematically showing a configuration of a photomask supply system.

An embodiment of the present invention is now described in conjunction with the drawings. In the following description, the same components are denoted by the same reference character, identified by the same name and have the same function. Thus, description of the same components will not be repeated. In addition, although the present invention will be described chiefly as applied to a photomask supply system, the invention is applicable to a photomask supply system and a photomask supply program as well.

FIG. 1 is a block diagram schematically showing a configuration of a photomask supply system.

Referring to FIG. 1, the photomask supply system according to this embodiment includes an element dimension calculating unit 100 included in a mask maker 10 which produces photomasks, a dimension accuracy database 101 correlating, in advance, production conditions of the photomask with dimension accuracy of the photomask to store the correlation as a database and supplying/receiving data to/from element dimension calculating unit 100, an element dimension measuring unit 200 included in mask maker 10 for measuring the finished dimension of an element pattern of a produced mask according to a measurement recipe supplied from element dimension calculating unit 100 via a communication line 500, an order-receiver computer 400 included in mask maker 10, a price list database 410 correlating such production conditions as an element dimension as well as a dimension-measurement method with price data to store the correlation and supplying/receiving data to/from order-receiver computer 400, and an order-sender computer 300 included in an IC chip maker 20 for informing order-receiver computer 400 of design data of the mask, production conditions of the mask and a measurement method of the mask for example via communication line 500.

Communication line 500 may be a dedicated line. However, in a communication environment with ensured security protection, for example, an environment where a virtual private network for example can be implemented, such a public line as the Internet may be used for communication line 500.

Element dimension calculating unit 100 stores data supplied from order-receiver computer 400 and, according to the stored data, prepares the measurement recipe for measuring the dimension of an element as described above, or updates production error data relating to data concerning production conditions (production condition data) of the photomask and the structure and design dimension of the mask design data and, stores the updated production error data in advance to determine, through simulation, any production error with respect to the mask design data supplied from an order-sender.

Further, element dimension calculating unit 100 calculates the time required for measurement (measurement time) performed by element dimension measuring unit 200 according to specification data concerning the photomask that is supplied from the order-sender and, according to the calculated measurement time, calculates cost estimate data. The calculated cost estimate data is transmitted to the order-sender via communication line 500.

Moreover, element dimension calculating unit 100 stores the production condition data of the photomask and, each time the mask is produced and the mask pattern is measured, updates and stores the production error data relating to the production condition data of the photomask and the mask design data and design dimension. According to the accumulated production error data, element dimension calculating unit 100 determines, through simulation, any production error with respect to the mask design data supplied from the order-sender.

The above-described functions of simulation for the production error as well as of cost estimate of the element dimension calculating unit 100 according to this embodiment are carried out through execution of a predetermined program by a CPU (central processing unit) of a computer.

Figure 2:
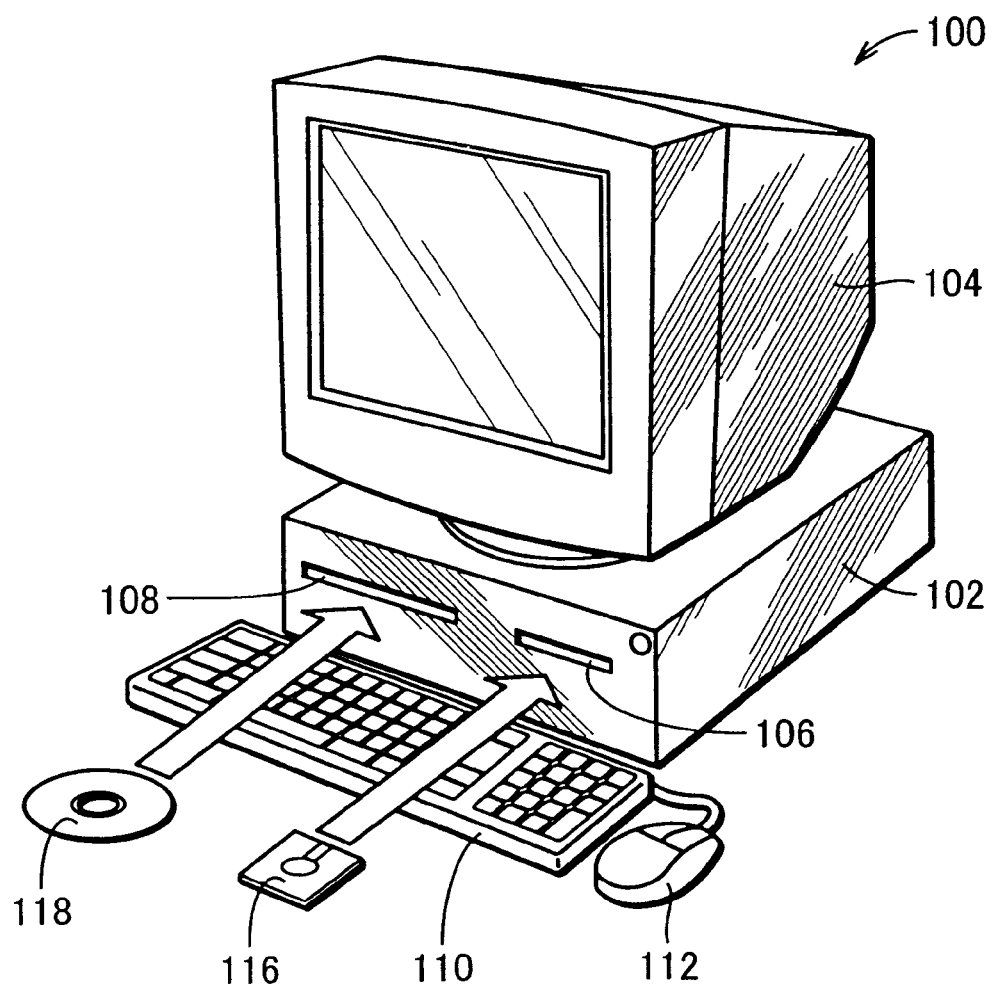
FIG. 2 externally shows a computer system as one example of an element dimension calculating unit 100.

FIG. 2 shows an external view of a computer system as one example of element dimension calculating unit 100. Referring to FIG. 2, this computer system includes a computer 102 having an FD (flexible disk) drive 106 and a CD-ROM (compact disc-read only memory) drive 108, a monitor 104, a keyboard 110 and a mouse 112.

Figure 3:
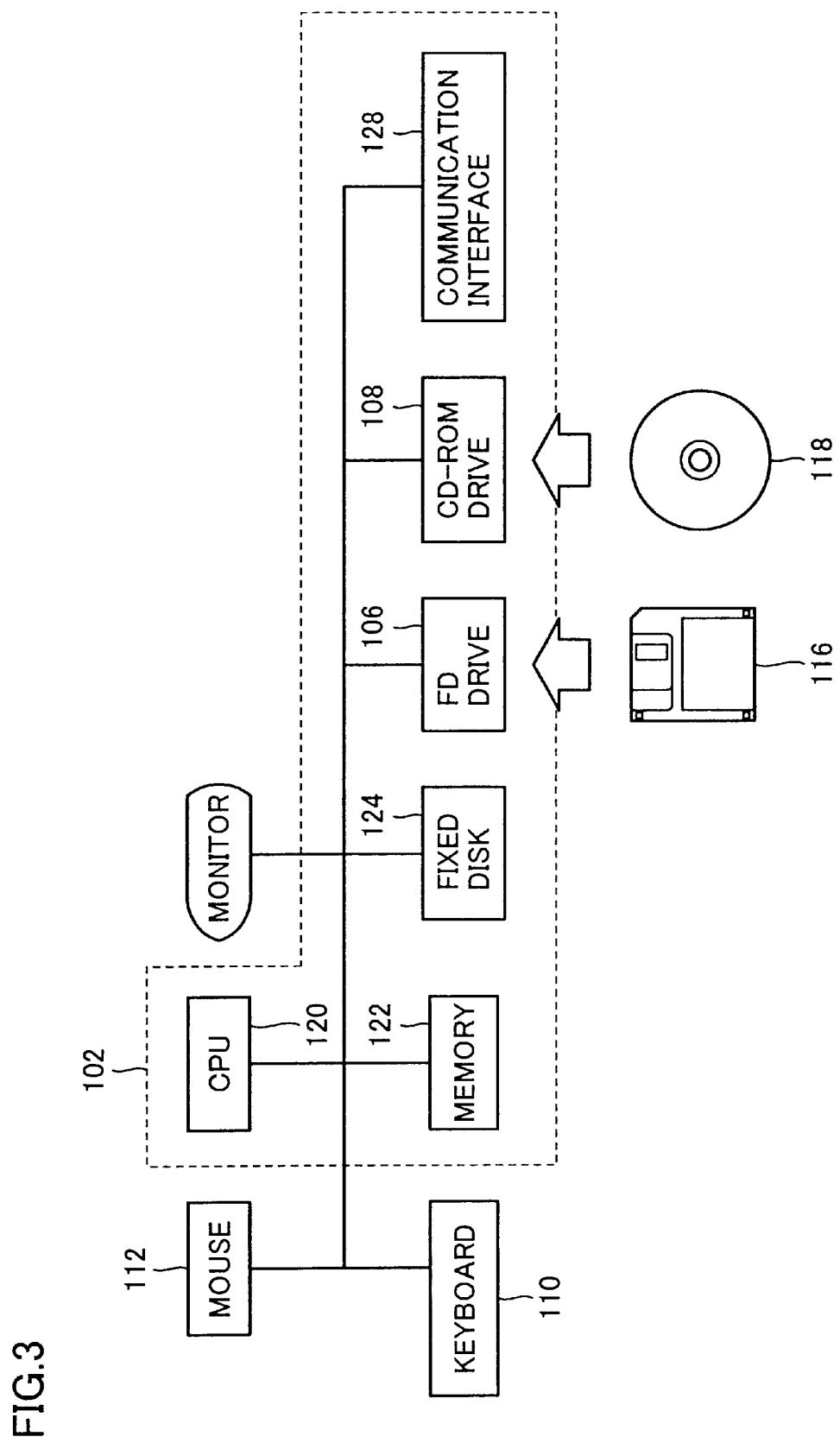
FIG. 3 is a block diagram showing a configuration of a computer system.

FIG. 3 is a block diagram showing a configuration of this computer system.

Referring to FIG. 3, computer 102 includes, in addition to FD drive 106 and CD-ROM drive 108 mentioned above, a CPU 120, a memory 122, a fixed (hard) disk 124, and a communication interface 128 for communication with other computers, for example, order-receiver computer 400 and a computer controlling element dimension measuring unit 200, and these components are connected to each other by a bus. An FD 116 is placed in FD drive 106. A CD-ROM 118 is placed in CD-ROM drive 108. FD 116 and CD-ROM 118 store predetermined programs corresponding to software.

As discussed above, the functions of element dimension calculating unit 100 are carried out by computer hardware and software executed by CPU 120. In general, such software is distributed as a program stored on such a recording medium as FD 116 or CD-ROM 118, read from the recording medium by FD drive 106 or CD-ROM drive 108 and then stored temporarily on fixed disk 124. The program is further read from fixed disk 124 into memory 122 and executed by CPU 120.

The hardware itself of the computer as described above is of a general type. The computer includes a control circuit including a CPU, a storage circuit, an input circuit, an output circuit and an OS (operating system) and accordingly has an environment for execution of a program. The program of the present invention allows the computer to serve as element dimension calculating unit 100. Thus, the most essential element of the present invention is a program recorded on such a recording medium as FD, CD-ROM, memory card or fixed disk.

The computer shown in FIGS. 2 and 3 operates in a known manner, and thus description thereof will not particularly be given here.

Figure 4:
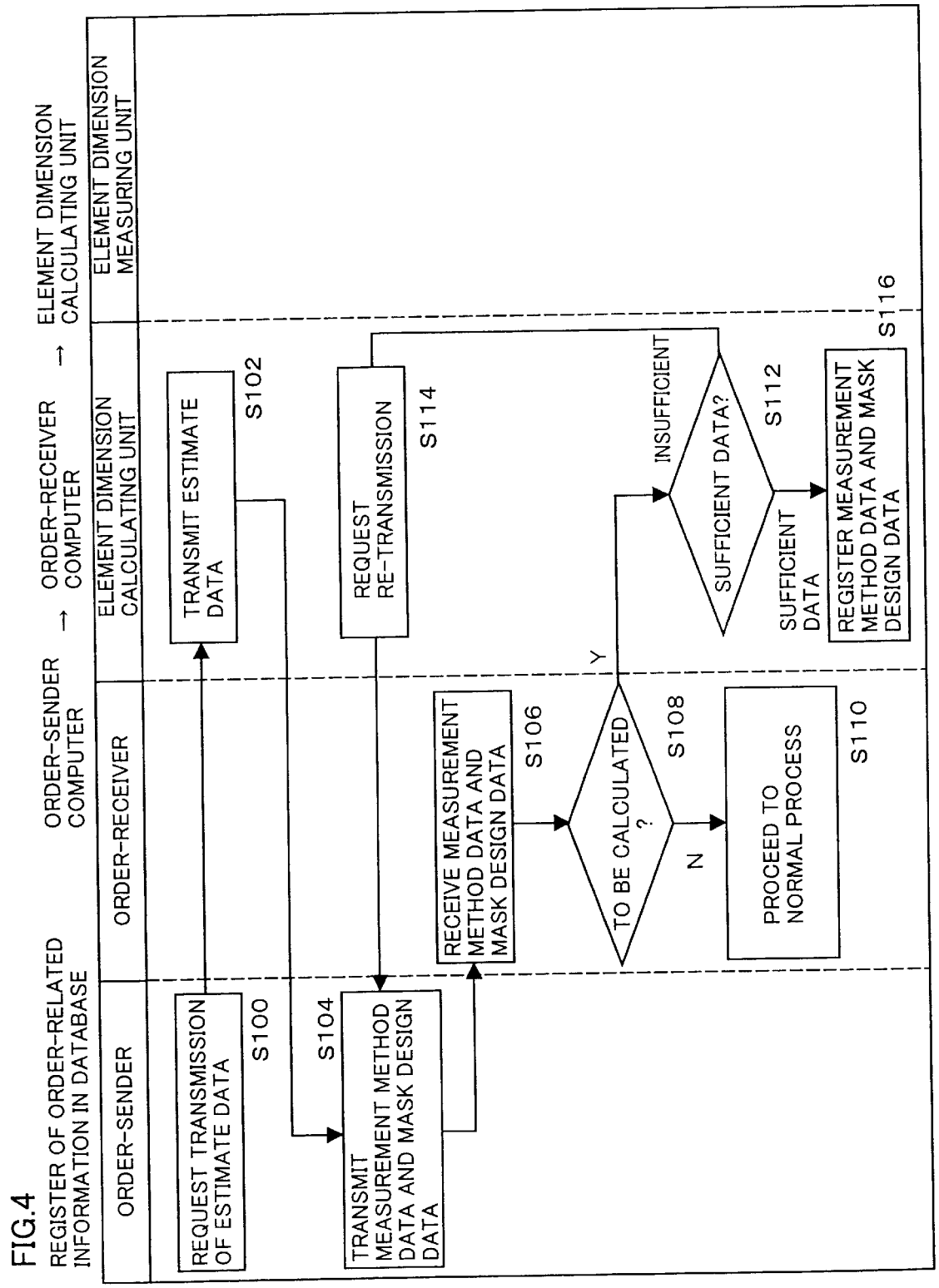
FIG. 4 is a first flowchart illustrating an operation of the photomask supply system shown in FIG. 1.

FIG. 4 is a first flowchart illustrating an operation of the photomask supply system shown in FIG. 1.

Specifically, FIG. 4 shows a flow for a process of registering order-related information in element dimension calculating unit 100 by order-sender computer 300.

Referring to FIG. 4, an order-sender requests element dimension calculating unit 100 to transmit estimate data via order-receiver computer 400 (step S100).

The request to transmit estimate data includes data based on which the estimate data is generated as discussed later.

According to the request for estimate data transmission, element dimension calculating unit 100 generates estimate data which is accordingly transmitted to order-sender computer 300 (step S102).

Here, the estimate data may be generated, according to information supplied from the order-sender, as a list of a plurality of alternatives from which a choice is made.

Based on the estimate data supplied from element dimension calculating unit 100, order-sender computer 300 transmits data concerning a measurement method (hereinafter "measurement method data") as well as mask design data, that are finally determined by the order-sender (step S104).

Order-receiver computer 400 receives the measurement method data and the mask design data that are transmitted from order-sender computer 300 (step S106) to determine, if order details specified by the order-sender are to be handled through calculation by element dimension calculating unit 100 or all the details are to be handled according to data concerning actual measurement without performing calculation (step 108).

If the order details provided from the order-sender require all of designated patterns of a photomask to actually be measured, the photomask is produced through a normal photomask production process, the patterns, which are designated by the order-sender, of the resultant photomask are measured, production error data is calculated based on actual measurements only, and the calculated production error data is transmitted in return to order-sender computer 300 (step S110).

At this time, in parallel with transmission of the production error data, photomasks that have actually been produced are delivered to the order-sender, for example, IC chip maker 20.

In step S108, if the order details provided from the order-sender require that, the production error data for the produced photomask should be calculated partially or entirely through arithmetic operation (simulation), order-receiver computer 400 transmits the measurement method data and the mask design data to element dimension calculating unit 100. According to the supplied measurement method data and mask design data, element dimension calculating unit 100 determines if there is provided sufficient data to calculate the production error data (step S112). If the data is insufficient, element dimension calculating unit 100 requests order-sender computer 300 to re-transmit data (step S114). Order-sender computer 300 receiving the re-transmission request supplies additional data in accordance with the re-transmission request to carry out the process in step S104 as described above.

In step S112, if element dimension calculating unit 100 determines that there is provided sufficient data to perform the arithmetic operation, element dimension calculating unit 100 registers the measurement method data and the mask design data on fixed disk 124 for example (step S116).

Here, "measurement method data" includes data for designating one of the following measurement methods.

A measurement method called "actual measurement of all points" refers to actual measurement of all patterns designated by the order-sender.

A measurement method called "actual measurement of monitor mark" refers to measurement of monitor marks designated by the order-sender instead of device patterns.

A measurement method called "actual measurement of device pattern" refers to actual measurement of all device patterns designated by the order-sender.

According to a measurement method called "all-point measurement," several representative points on one of patterns designated by the order-sender are measured for correcting simulation. For remaining patterns, a production error is calculated through simulation based on data which is provided in advance, the data indicating a correlation between element patterns and measurement errors. This method achieves higher accuracy than that of all-point simulation described later, since the former method makes correction by actual measurements.

According to a measurement method called "monitor mark measurement," similarly to "all-point measurement" described above, several representative points on one of monitor marks designated by the order-sender instead of device patterns are measured for correcting simulation, and, for remaining monitor marks, a production error is calculated through simulation.

According to a measurement method called "device pattern measurement," representative points on one of designated device patterns are measured for correcting simulation and, for remaining patterns, a production error is calculated through simulation.

According to a measurement method called "specific dimension measurement," several representative points on one of patterns having a designated dimension are measured for correcting simulation and, for remaining patterns, a production error is calculated through simulation.

According to a measurement method called "all-point estimate," a production error is calculated through simulation for all points on designated patterns based on data, provided in advance, indicating a correlation between element patterns and production errors.

According to a measurement method called "monitor mark estimate," a production error is calculated through all-point simulation for monitor marks designated instead of device patterns.

According to a measurement method called "device pattern estimate," a production error is calculated through all-point simulation for designated device patterns.

According to a measurement method called "specific dimension estimate," a production error is calculated through all-point simulation for patterns having a designated dimension.

In the following description, in principle, the order-sender designates a measurement method by which actual measurement of representative points and simulation are performed, such as "all-point measurement," "monitor mark measurement," "device pattern measurement" or "specific dimension measurement" for example. Here, if simulation is conducted for all points, the actual measurement of representative points is merely dispensed with.

Figure 5:
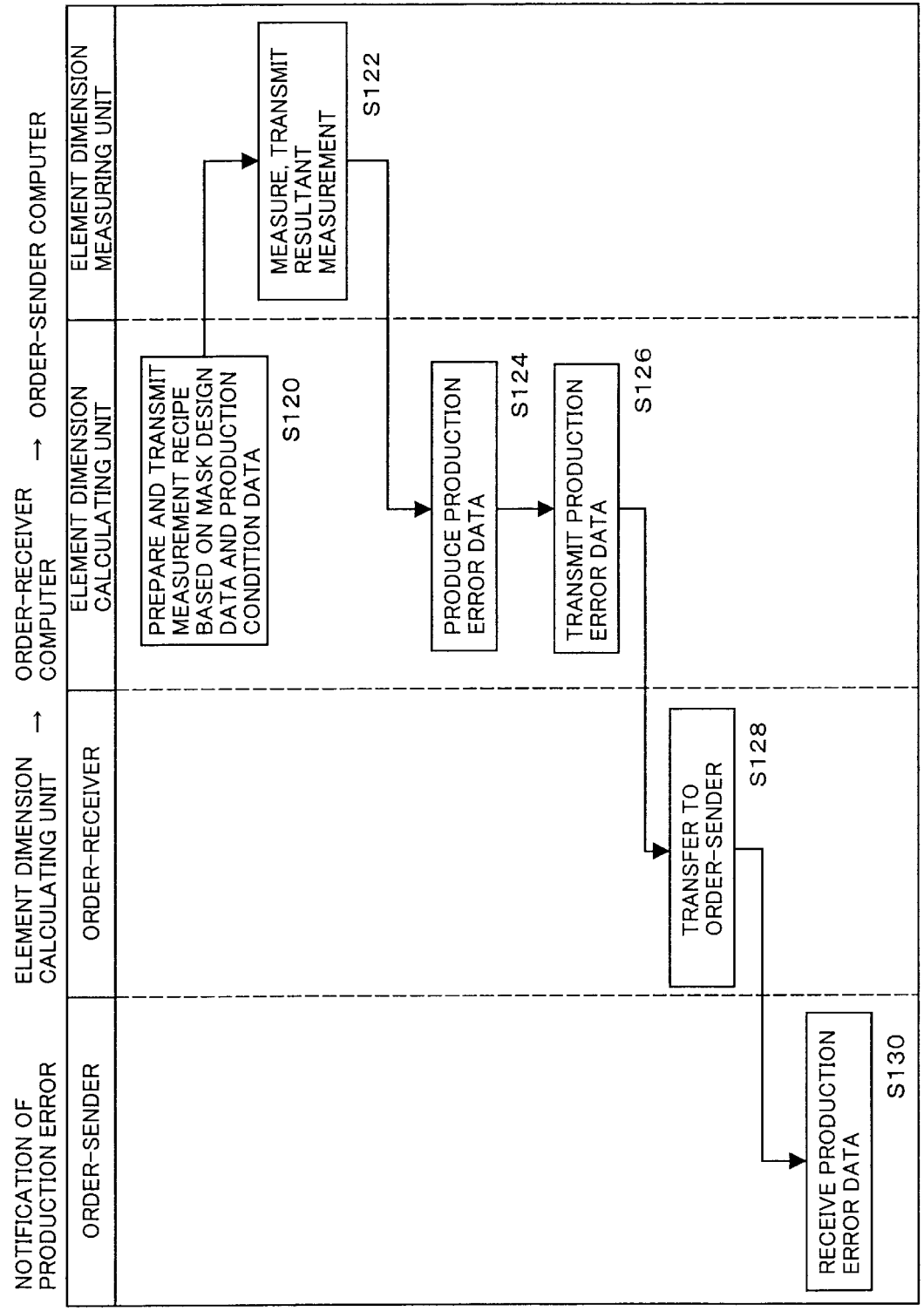
FIG. 5 is a second flowchart illustrating a process, after the process in FIG. 4, followed by the photomask supply system shown in FIG. 1.

FIG. 5 is a second flowchart illustrating a process subsequent to the process in FIG. 4 that is followed by the photomask supply system shown in FIG. 1.

Specifically, the process shown in FIG. 5 is followed to finally transmit production error data from element dimension calculating unit 100 to order-sender computer 300.

Referring to FIG. 5, subsequent to the process in step S116 as described in connection with FIG. 4, element dimension calculating unit 100 prepares a measurement recipe based on the mask design data and production condition data stored for example in dimension accuracy database 101 shown in FIG. 1, and transmits the recipe to element dimension measuring unit 200 (step S120). In the production condition data, order details from the order-sender and previous production conditions of the photomask are correlated with production error data of the accordingly produced photomask.

Element dimension measuring unit 200 measures the dimension of a designated pattern of a produced photomask according to the measurement recipe and then transmits a resultant measurement in return to element dimension calculating unit 100 (step S122).

Based on the resultant measurement supplied in return, element dimension calculating unit 100 produces production error data which is calculated from the actually measured pattern dimension, and an element pattern and corresponding actual measurement data stored in dimension accuracy database 101 (step S124).

Element dimension calculating unit 100 transmits the produced production error data to order-receiver computer 400 (step S126). Order-receiver computer 400 then transfers the supplied production error data to order-sender computer 300 (step S128).

Order-sender computer 300 receives the production error data from order-receiver computer 400 (step S130).

Here, as the normal process in step S110 described in connection with FIG. 4, photomasks that have actually been produced are delivered from photomask maker 10 to IC chip maker 20 in parallel with the transmission of the production error data to order-sender computer 300.

Figure 6:
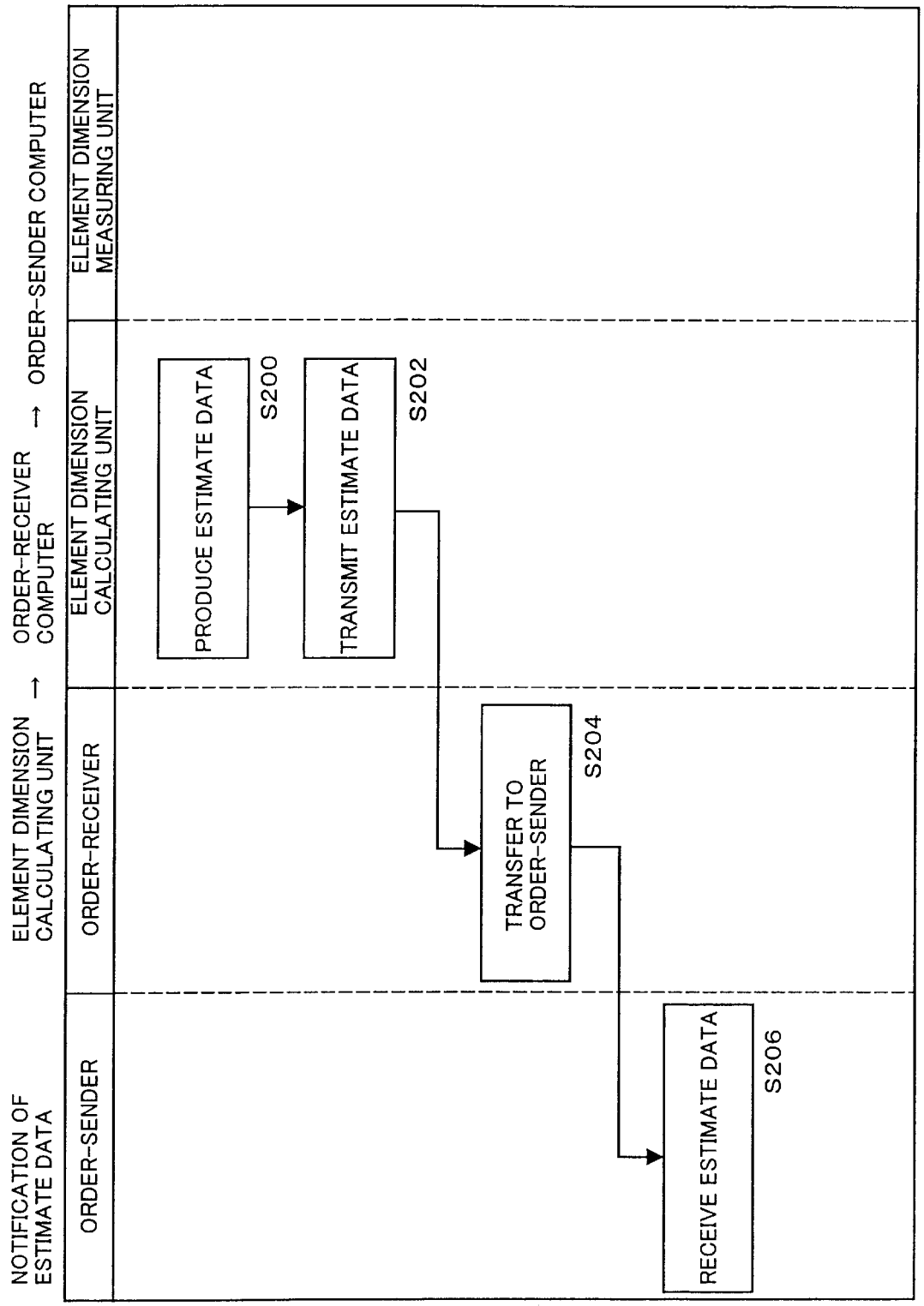
FIG. 6 is a flowchart illustrating the process in the flowchart of FIG. 4 of transmitting estimate data from the element dimension calculating unit 100.

FIG. 6 is a flowchart illustrating the process in the flowchart of FIG. 4 of transmitting estimate data from element, dimension calculating unit 100.

Referring to FIG. 6, element dimension calculating unit 100 produces the estimate data (step S200) to transmit the estimate data to order-receiver computer 400 (step S202).

Order-receiver computer 400 then transfers the estimate data to order-sender computer 300 (step S204). Order-sender computer 300 receives the estimate data from order-receiver computer 400 (step S206).

Figure 7:
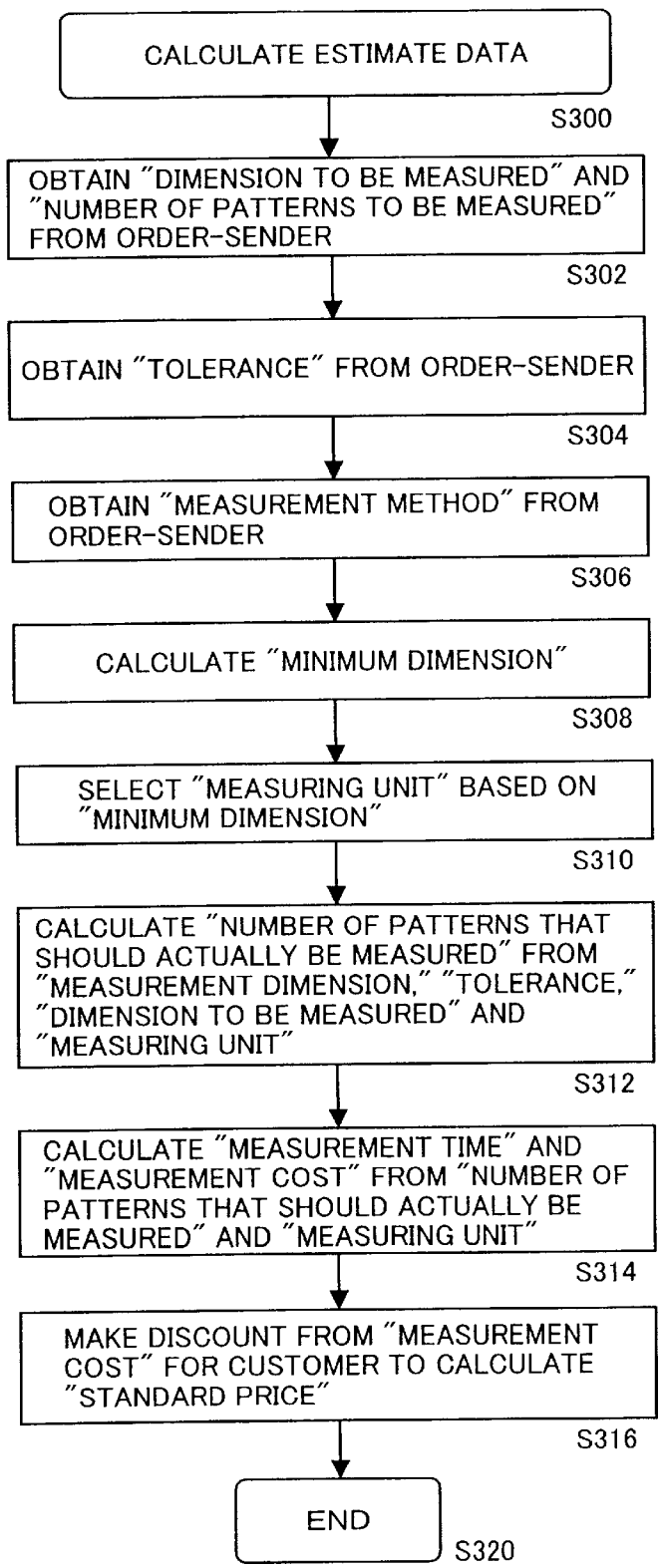
FIG. 7 is a flowchart illustrating the process in step S200 described in connection with FIG. 6 of preparing estimate data by the element dimension calculating unit 100.

FIG. 7 is a flowchart illustrating the process in step S200 described in connection with FIG. 6 of producing estimate data by element dimension calculating unit 100.

Referring to FIG. 7, calculation of the estimate data is started (step S300). Element dimension calculating unit 100 refers to the order details provided from the order-sender to obtain "dimension to be measured" and "the number of patterns to be measured" according to order details supplied from the order-sender (step S302).

Element dimension calculating unit 100 then obtains "tolerance" according to the order details from the order-sender (step S304).

Moreover, element dimension calculating unit 100 obtains "measurement method" according to the order details from the order-sender (step S306)

According to the above-described data derived from the order details provided from the order-sender, element dimension calculating unit 100 calculates "minimum dimension" used for calculating a production error (step S308).

Then, in calculating a production error according to the calculated "minimum dimension," element dimension calculating unit 100 selects a measuring unit for obtaining actual measurement data (step S310).

Further, based on "measurement dimension," "tolerance," "dimension to be measured" and "measuring unit," element dimension calculating unit 100 calculates "the number of patterns that should actually be measured." (step S312).

Element dimension calculating unit 100 uses "the number of patterns that should actually be measured" calculated in step S312 and "measuring unit" to determine "measurement time" which is the sum of the time required for performing actual measurement and the time required for performing simulation, and calculates "measurement cost" according to "measurement time" (step S314).

In the process of calculating "measurement cost," "measurement cost" may be increased according to an estimated production yield of ordered photomasks, the production yield being calculated with reference to data regarding production yield of conventional photomask products with respect to "tolerance" allowed in production.

Element dimension calculating unit 100 makes a discount from "measurement cost" for the customer to calculate "standard price." (step S316).

In this way, calculation of the estimate data is completed (step S320).

FIG. 8 shows one example of the estimate data generated by following the flow described in connection with FIG. 7.

The estimate data is transmitted from element dimension calculating unit 100 to order-sender computer 300 via order-receiver computer 400 as described in connection with FIG. 6.

The estimate data thus includes header information indicating that the transmitted data is the estimate data and specifying a sender, i.e., order-receiver computer 400 or a destination, i.e., order-sender computer 300 for example.

The standard price following the header information as shown in FIG. 8 is calculated according to the tolerance (the unit thereof is nm for example), the measurement method, the number of patterns to be measured and the minimum dimension (the unit thereof is nm for example). For example, if the tolerance is ±50 nm, the measurement method is "actual measurement of all points," the number of patterns to be measured is up to 49, and the minimum dimension is 800 nm, the calculated standard price ¥80,000 is provided to order-sender computer 300. If the tolerance is ±50 nm, the measurement method is "all-point measurement" (actual measurement of representative points and simulation), the number of patterns to be measured is up to 49 and the minimum dimension is 800 nm, the calculated standard price ¥56,000 is provided to order-sender computer 300.

Figure 9:
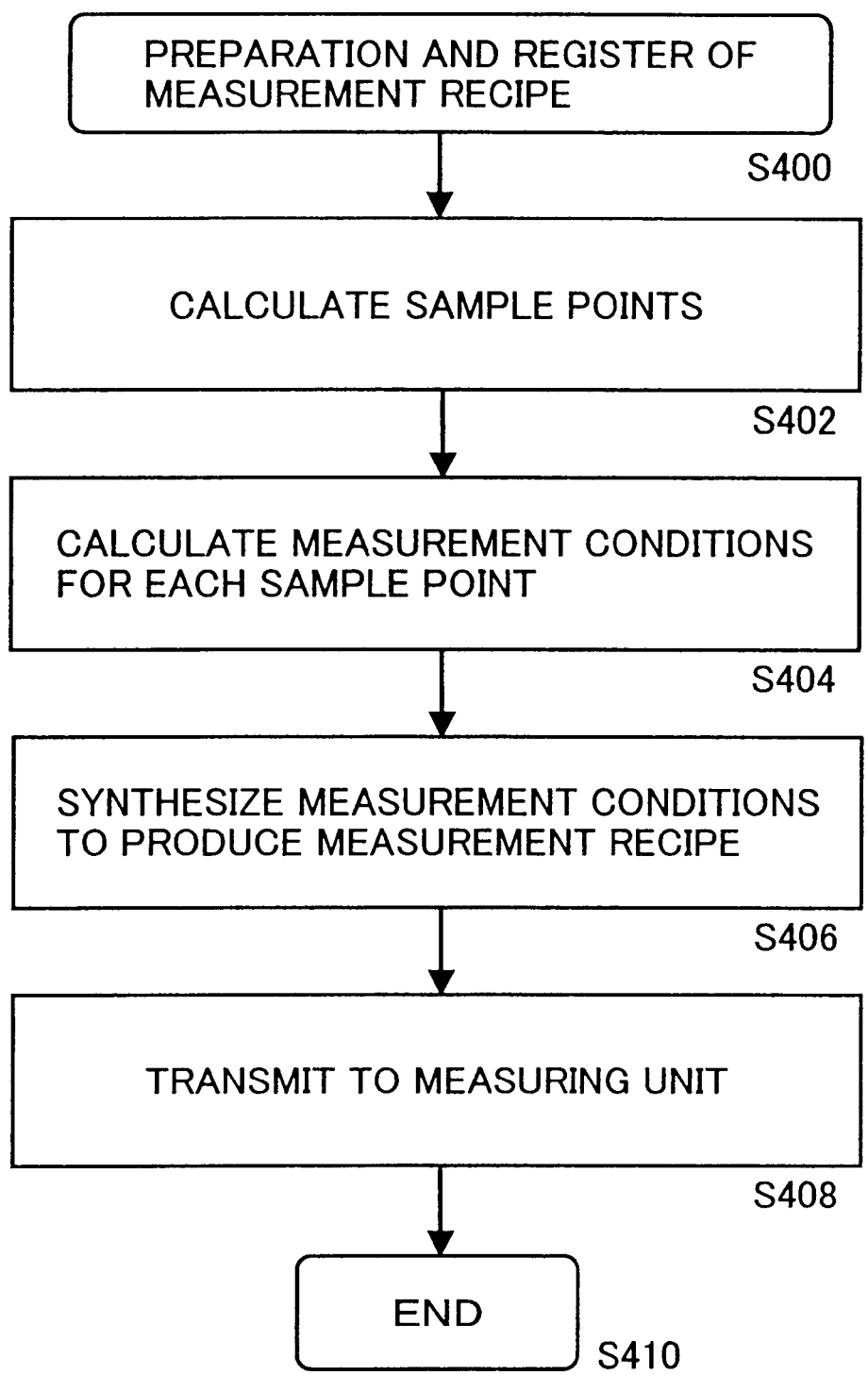
FIG. 9 is a flowchart illustrating a process of preparing the measurement recipe by the element dimension calculating unit 100 as described in connection with step S120 of FIG. 5.

FIG. 9 is a flowchart illustrating the process of preparing the measurement recipe by element dimension calculating unit 100 as described in connection with step S120 of FIG. 5.

Referring to FIG. 9, preparation and register of the measurement recipe is started (step S400). Then, according to the mask design data and production condition data for example, element dimension calculating unit 100 calculates respective positions of points on a reticle to be measured (the points to be measured are hereinafter referred to as "sample points") (step S402).

Element dimension calculating unit 100 calculates measurement conditions for each sample point (step S404).

Here, "measurement conditions" refer to such conditions as pattern number of a pattern to be measured, position of the pattern, shape of the pattern, design dimension of the pattern, tone of the pattern, range of measurement, field of view of measurement and focus position. The measurement conditions are described later.

Element dimension calculating unit 100 synthesizes the measurement conditions to prepare a recipe for carrying out measurement (step S406).

Then, element dimension calculating unit 100 transmits the measurement recipe to the element dimension measuring unit (step S408).

In this way, preparation and register of the measurement recipe are completed (step S410).

Figure 10:
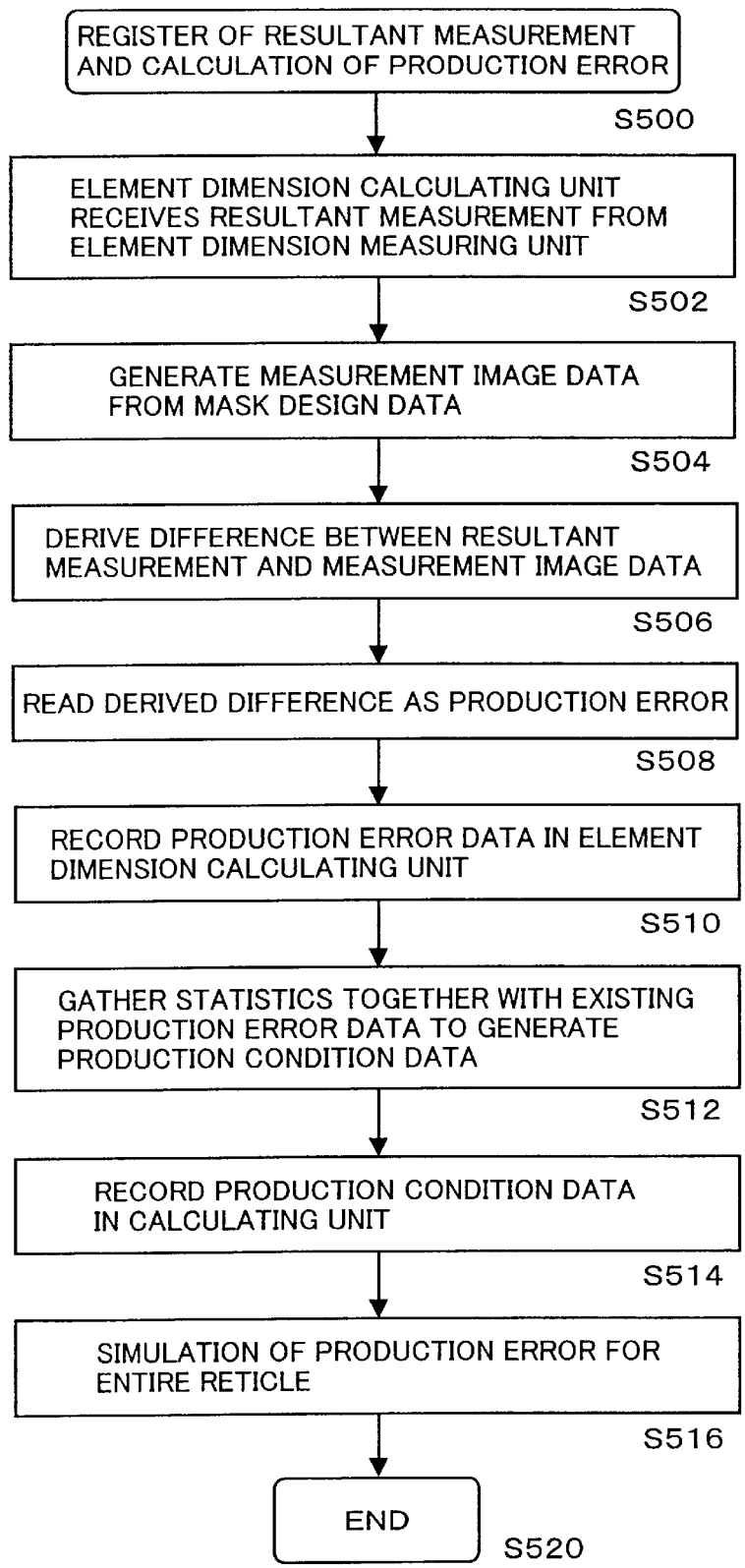
FIG. 10 is a flowchart illustrating generation of production error data by the element dimension calculating unit 100 in step S124 shown in FIG. 5.

FIG. 10 is a flowchart illustrating the process of generating production error data by element dimension calculating unit 100 in step S124 shown in FIG. 5.

Referring to FIG. 10, register of a resultant measurement and calculation of a production error are started (step S500). Element dimension calculating unit 100 receives from element dimension measuring unit 200 resultant measurements for a plurality of representative points (step S502).

Subsequently, element dimension calculating unit 100 generates measurement image data for an element pattern to be measured that is produced from the mask design data (step S504).

In other words, "measurement image data" refers to data indicating the shape of a mask pattern which is supposed to be produced from the mask design data with the production error being 0.

Then, element dimension calculating unit 100 derives a difference between the resultant measurement and the measurement image data generated in step S504 (step S506).

Element dimension calculating unit 100 reads the derived difference as a production error (step S508) and records the production error data on fixed disk 124 for example in element dimension calculating unit 100 (step S510).

Further, element dimension calculating unit 100 gathers statistics of production error data together with production error data of photomasks that have been produced to generate production condition data for manufacturing photomasks (step S512).

Then, element dimension calculating unit 100 records the production condition data on fixed disk 124 for example in the calculating unit (step S514).

Subsequently, for the entire reticle, element dimension calculating unit 100 performs simulation of the production error according to actual measurement of representative points by element dimension calculating unit 200 and the production condition data produced in step S512 for example (step S516).

In this way, register of the resultant measurement and calculation of the production error are completed (step S520).

Figure 11:
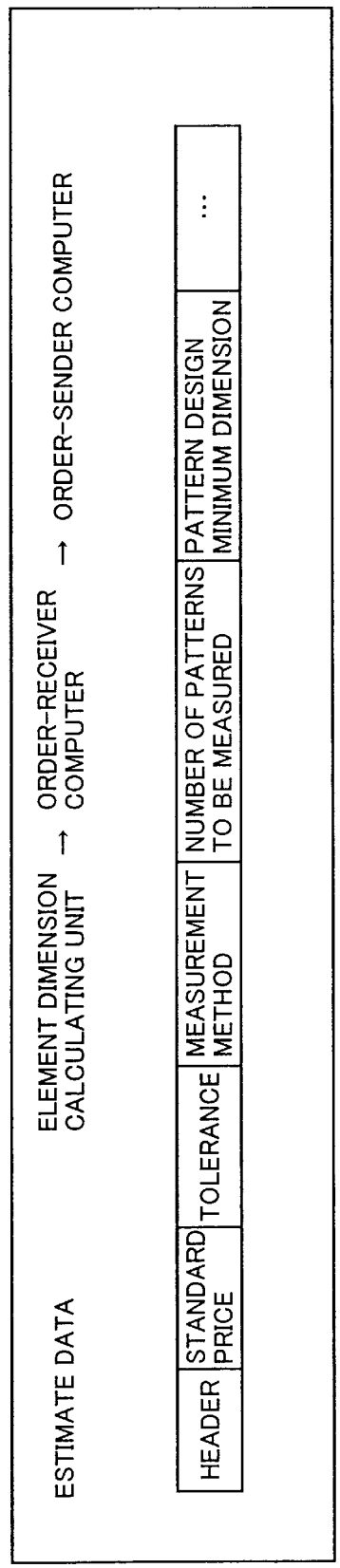
FIG. 11 conceptually shows estimate data transmitted to an order-sender computer 300.

FIG. 11 conceptually shows a structure of the estimate data generated by element dimension calculating unit 100 and transmitted to order-sender computer 300 via order-receiver computer 400 as described in connection with FIGS. 4 and 6.

Referring to FIG. 11, the estimate data includes a header having a flag indicating that this data is the estimate data, a standard price calculated according to order details provided from the order-sender, a tolerance used in calculating the standard price, a measurement method used in calculating the standard price, the number of patterns to be measured that is used in calculating the standard price, and a pattern design minimum dimension used in calculating the standard price.

Figure 12:
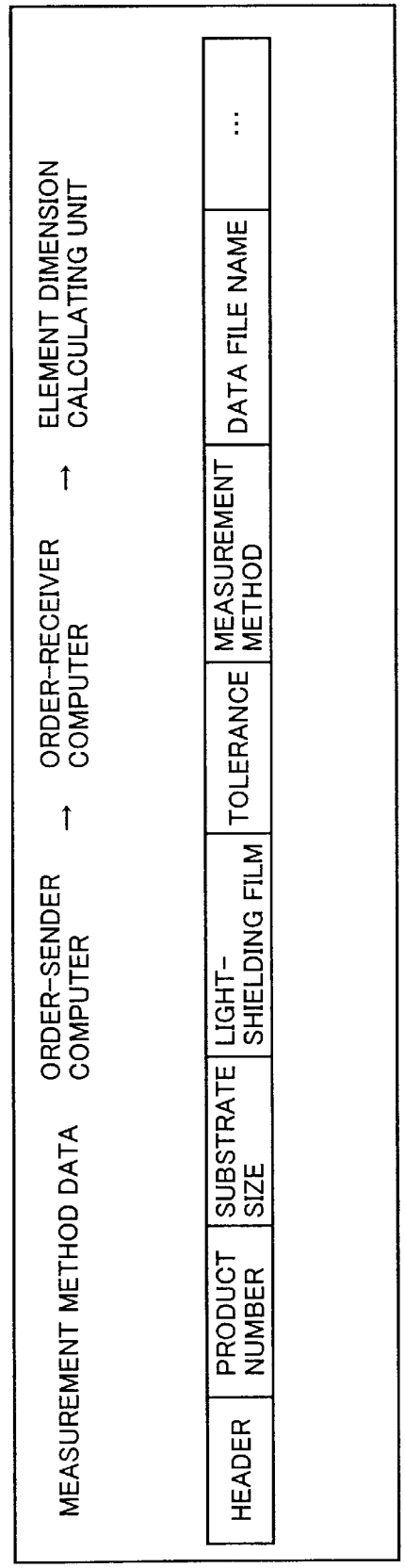
FIG. 12 conceptually shows a structure of measurement method data that is transmitted to the element dimension calculating unit 100.

FIG. 12 conceptually shows a structure of the measurement method data that is transmitted from order-sender computer 300 to element dimension calculating unit 100 via order-receiver computer 400 in step S104 described in connection with FIG. 4.

Referring to FIG. 12, the measurement method data includes a header having a flag indicating that this data is the measurement method data, a product number of the ordered photomask, a substrate size of the ordered photomask, data specifying the type of a light-shielding film used for the ordered photomask, a tolerance of the ordered photomask, a measurement method for the ordered photomask, and a data file name for specifying "mask design data" including design data for specifying any pattern included in the ordered photomask.

Here, "light-shielding film" includes, for example, chromium (Cr) thin film, molybdenum silicide (MoSi) thin film, tantalum silicide (TaSi) thin film, and chromium oxide ($Cr_xO_y$) thin film.

"Tolerance" refers to an allowable production error between the dimension of a pattern of a designed figure after rounding by an address unit and the dimension of an actually produced photomask pattern.

"Measurement method" refers to data for specifying a measurement method employed by element dimension measuring unit 200 such as "actual measurement of all points" and "all-point measurement."

Figure 13:
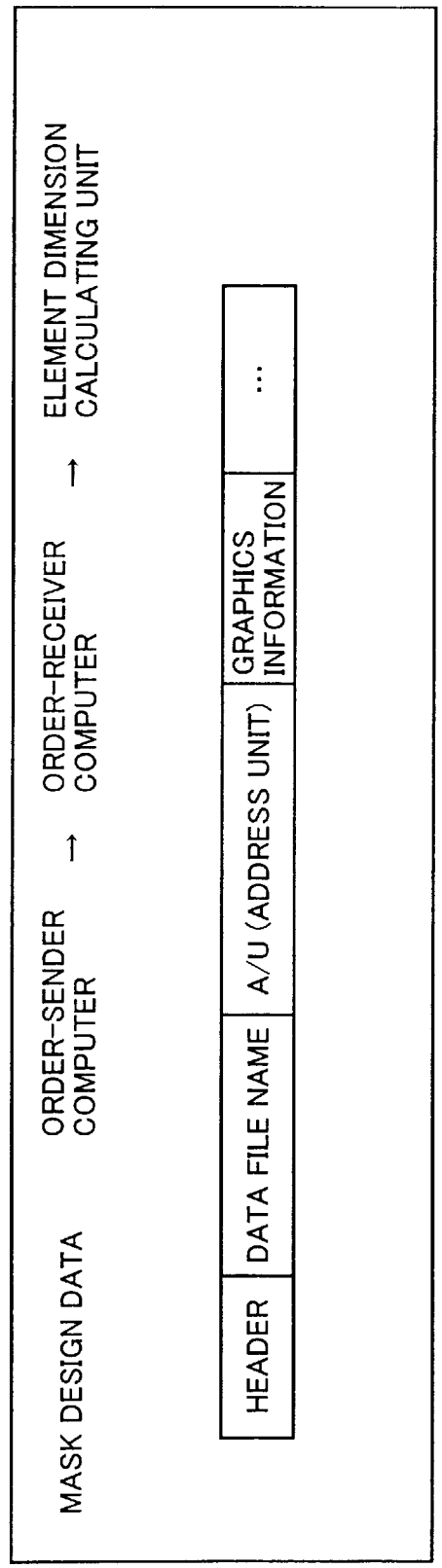
FIG. 13 conceptually shows a structure of mask design data transmitted to the element dimension calculating unit 100.

FIG. 13 conceptually shows a structure of the mask design data transmitted from order-sender computer 300 to element dimension calculating unit 100 via order-receiver computer 400 in step S104 shown in FIG. 4.

The mask design data is specified by "data file name" in the measurement method data shown in FIG. 12 as described above.

Referring to FIG. 13, the mask design data includes a header having a flag indicating that this data is the mask design data, the data file name specifying the mask design data, an address unit of the mask design data, and graphics information specifying each mask pattern on this address unit.

The address unit, for example, represents the dimension of a unit of a grid or lattice for specifying a mask pattern. The address unit is thus data corresponding to such a numerical value as 0.01 $\mu$m for example.

For a graphics representation of a rectangle for example, the graphics information is constituted of data concerning coordinates of opposing vertexes of the rectangle and a flag indicating that this information corresponds to data of the rectangle. For a triangular pattern, the graphics information is constituted of data concerning coordinates of opposing ends of the longer side and a flag indicating that this information corresponds to data of the triangle. However, the graphics information is not limited to the examples above. Each element pattern of a photomask is represented as a set of such individual graphics data.

Figure 14:
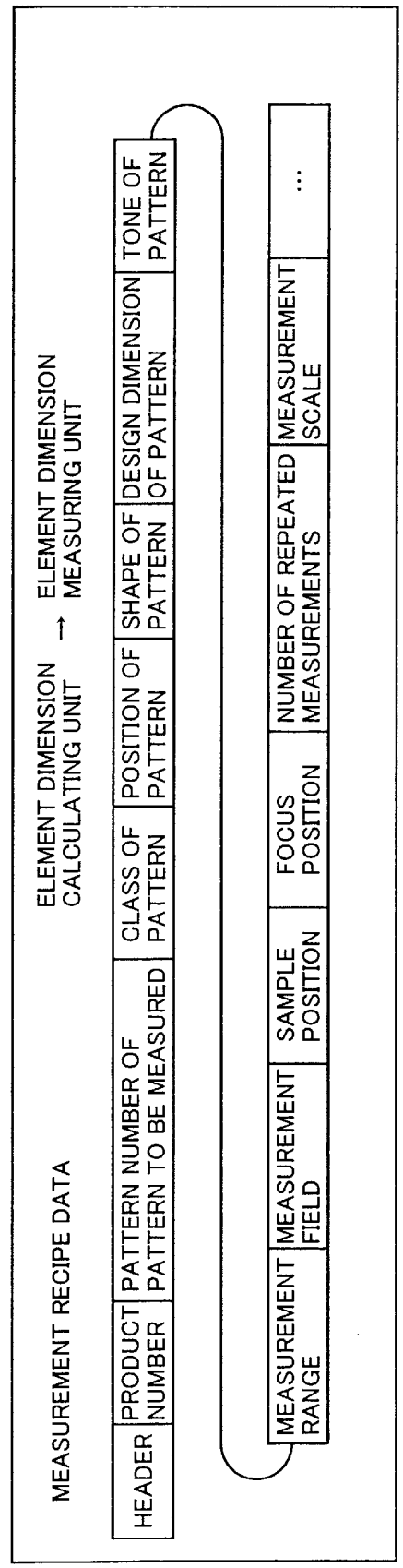
FIG. 14 conceptually shows a structure of "measurement recipe data" transmitted from the element dimension calculating unit 100 to an element dimension measuring unit 200.

FIG. 14 conceptually shows a structure of "measurement recipe data" transmitted from element dimension calculating unit 100 to element dimension measuring unit 200 in step S120 of FIG. 5 as described above.

Referring to FIG. 14, the measurement recipe data includes a header having a flag indicating that this data is the measurement recipe data, product number of the photomask, pattern number of a pattern to be measured, pattern class data indicative of the class or type of the pattern, data indicative of the position of the pattern, shape of the pattern, design dimension of the pattern, tone of the pattern, range of measurement (measurement window), data indicative of measurement field, data indicative of the position of a sample, data indicative of the focus position, data indicative of how many times measurement is repeated, and data indicative of measurement scale.

Here, the pattern number of a pattern to be measured refers to the number for specifying a pattern in the mask design data. The class of the pattern refers to data indicating that if the pattern is a device pattern or monitor pattern as described in relation with the measurement method.

The pattern position data refers to data indicating the position of the pattern to be measured, the position being indicated as a distance from a reference position on a reticle. The tone of the pattern refers to data indicating if the pattern to be measured is a pattern of a light-shielding film or a pattern of a quartz substrate.

The range of measurement refers to data specifying the measurement window as described above, for example, the width and length of the measurement window.

The measurement field refers to data indicating, if measurements are taken by means of an optical image, whether measurement is performed for transmitted light or reflected light.

The sample position data refers to data specifying the position of a reticle on a stage of the measuring unit.

The light-shielding film of the reticle on the quartz substrate has a certain thickness. Then, "focus position" refers to data indicating whether the focus position in measurement is on the surface of the quartz substrate, on the surface of the light-shielding film, or the intermediate between the surface of the shielding film and the surface of the quartz substrate.

Figure 15:
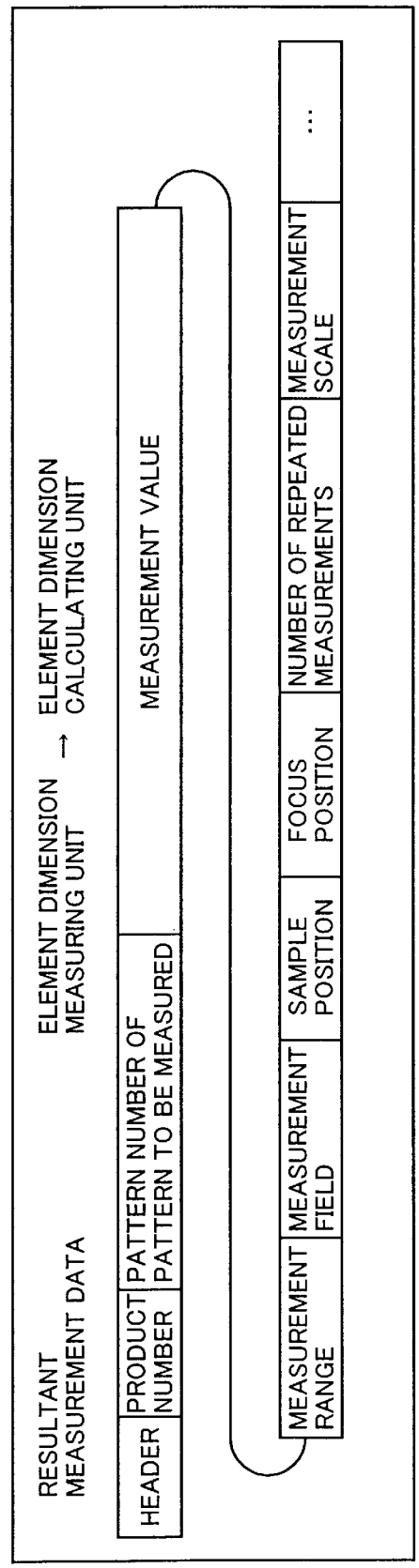
FIG. 15 conceptually shows a structure of "resultant measurement data" transmitted from the element dimension measuring unit 200 to the element dimension calculating unit 100.

FIG. 15 conceptually shows a structure of "resultant measurement data" transmitted from element dimension measuring unit 200 to element dimension calculating unit 100 in step S122 shown in FIG. 5.

Referring to FIG. 15, the resultant measurement data includes a header having a flag indicating that this data is the resultant measurement data, product number specifying the photomask, pattern number of a pattern to be measured, data regarding a measurement value, data indicating a measurement range, data indicating a measurement field, data indicating a sample position, data indicating a focus position, data indicating how many times measurement is repeated, and data indicating the scale of measurement.

Respective meanings of the above data items are those as described in connection with FIG. 14.

Figure 16:
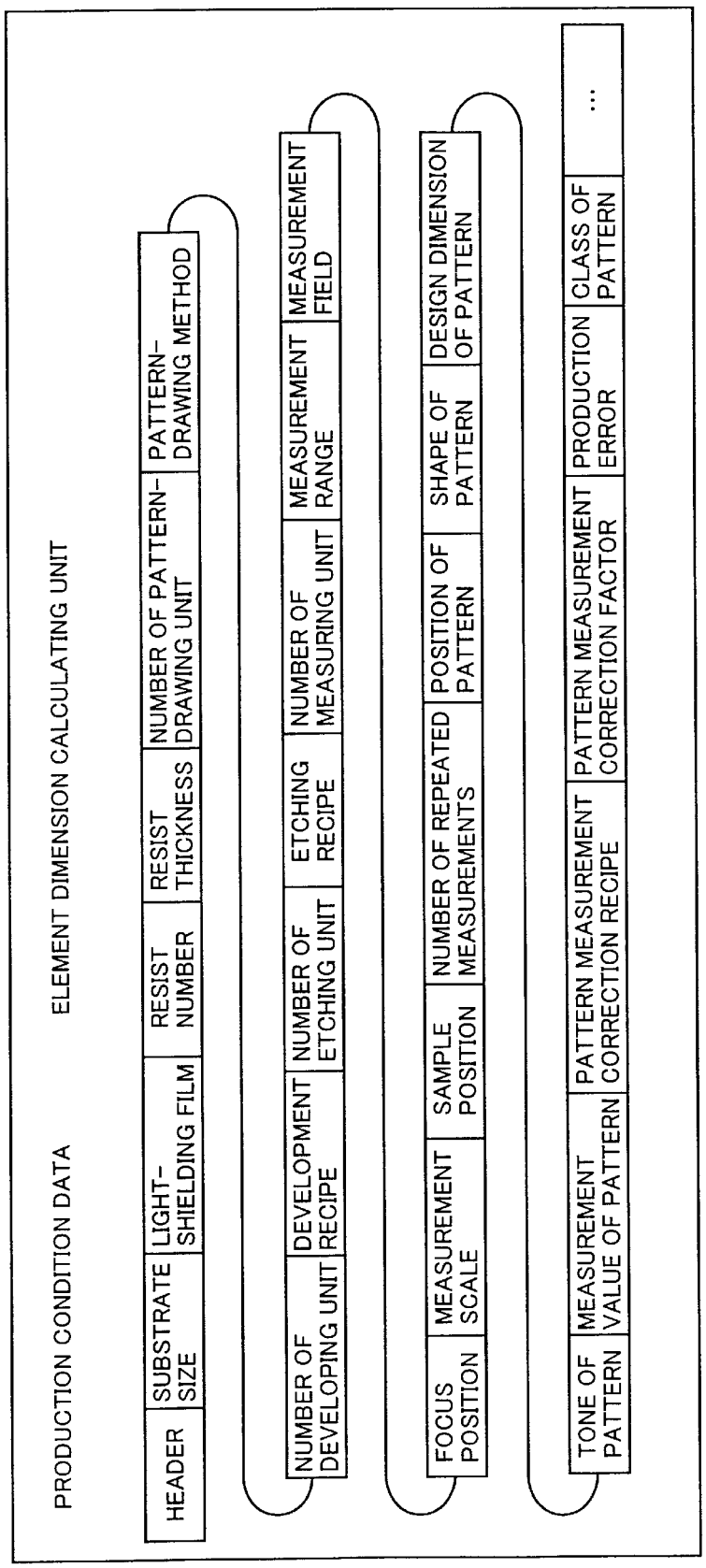
FIG. 16 conceptually shows a structure of production condition data transmitted to a fixed disk 124 in the element dimension calculating unit 100.

FIG. 16 conceptually shows a structure of the production condition data generated by the element dimension calculating unit and transmitted to fixed disk 124 in element dimension calculating unit 100 as described above in connection with step S512 in FIG. 10.

Referring to FIG. 16, the production condition data includes a header having a flag indicating that this data is the production condition data, substrate size, data indicative of the type of a light-shielding film, resist number indicating the type of a resist in processing the light-shielding film, the thickness of the resist in processing the light-shielding film, number of a pattern-drawing unit generating a pattern on the resist in processing the light-shielding film, data specifying a pattern-drawing method used by the pattern-drawing unit, number of a developing unit for developing the resist after pattern drawing, a development recipe for development of the resist, number of an etching unit for etching of the light-shielding film based on the developed resist pattern, an etching recipe for specifying etching conditions used by the etching unit, number of a measuring unit taking measurements after the light-shielding film is processed, data indicative of a measurement range, data indicative of a measurement field, data indicative of a focus position, data indicative of a measurement scale, data indicative of a sample position, data indicating how many times measurement is repeated, data indicative of a pattern position, data indicative of a pattern shape, data indicative of a pattern design dimension, data indicative of tone of the pattern, data indicative of a measurement value of the pattern, data indicative of a pattern measurement correction recipe, data indicative of a correction factor of pattern measurement, data indicative of a production error, and data indicative of a pattern class.

Here, "pattern-drawing method" refers to data specifying a method of drawing or generating a pattern on a resist used for processing the light-shielding film. Examples of the pattern-drawing method include "single-phase drawing," "multiphase drawing" and "gray scale multiphase drawing."

Such data as "pattern measurement correction recipe" and "correction factor of pattern measurement" specify any method of correcting simulation value based on resultant measurements of representative points.

Figure 17:
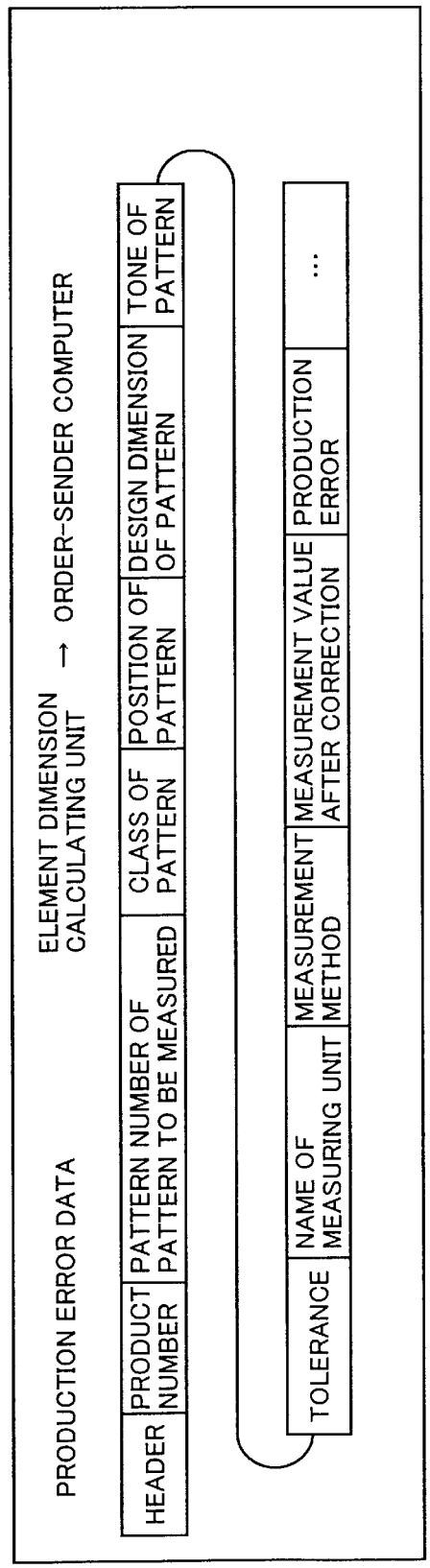
FIG. 17 conceptually shows a structure of production error data transmitted from the element dimension calculating unit 100 to the order-sender computer 300.

FIG. 17 conceptually shows a structure of the production error data generated in step S124 in FIG. 5 and transmitted from element dimension calculating unit 100 to order-sender computer 300.

Referring to FIG. 17, the production error data includes a header having a flag indicating that this data is the production error data, product number specifying the photomask, pattern number of a pattern to be measured, pattern class, pattern position, pattern design dimension, tone of the pattern, tolerance, name of a measuring unit, measurement method, measurement value after correction, and data regarding a production error.

Referring to FIG. 18 showing the estimate data transmitted from element dimension calculating unit 100 to order-sender computer 300 via order-receiver computer 400 and recorded on the fixed disk for example in the order-sender computer.

As shown in FIG. 18, the estimate data includes a standard price calculated according to order details provided from the order-sender, a tolerance and a measurement method used for referring to the standard price, the number of patterns to be measured, and data on the minimum dimension of pattern design.

The estimate data is generated in element dimension calculating unit 100 according to order details from the order-sender as discussed above.

FIG. 19 conceptually shows the measurement method data transmitted from order-sender computer 300 to element dimension calculating unit 100 via order-receiver computer 400 and then recorded on fixed disk 124 in element dimension calculating unit 100.

The measurement method data includes product number specifying the mask, substrate size of the mask, data specifying the type of a light-shielding film of the mask, tolerance of the mask, measurement method of the mask, and data on a data file name specifying design data in fabricating the mask.

Such measurement method data is generated in order-sender computer 300 according to a required specification of the photomask to be fabricated as well as design data, and then transmitted to element dimension calculating unit 100 via order-receiver computer 400.

Figure 20:
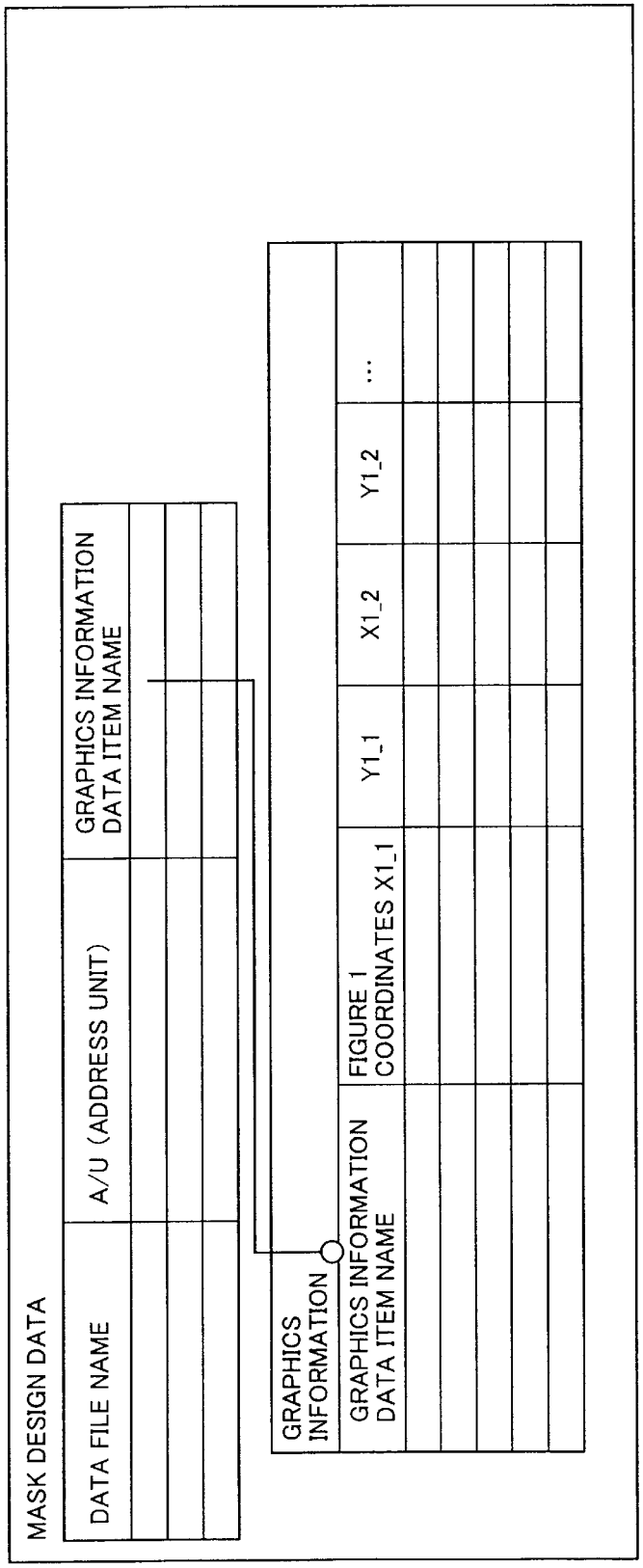
FIG. 20 conceptually shows a structure of mask design data transmitted to the element dimension calculating unit 100 and recorded on the fixed disk in the element dimension calculating unit 100.

FIG. 20 conceptually shows a structure of the mask design data transmitted from order-sender computer 300 to element dimension calculating unit 100 via order-receiver computer 400 and recorded on the fixed disk in element dimension calculating unit 100 as described in connection with FIG. 13.

Referring to FIG. 20, the mask design data includes data file name specifying the mask design data, data specifying an address unit and graphics information data items.

Here, the graphics information data includes a graphics information data item name specifying each element pattern, data of each of coordinates X1__1, Y1__1, X1__2, and Y1__2 for example for specifying the graphics information data item, and data of a flag specifying a figure.

Such data is generated by the order-sender with order-sender computer 300 based on data supplied from a design section or by directly copying the data supplied from the design section. Then, the generated data is changed in form to transmission data in order-sender computer 300 and transmitted to order-receiver computer 400.

FIG. 21 conceptually shows a structure of the measurement recipe data transmitted from element dimension calculating unit 100 to element dimension measuring unit 200 as described in connection with FIG. 14.

The measurement recipe data including such data as the product number specifying the photomask, is generated in element dimension calculating unit 100 based on the mask design data and measurement method data provided from the order-sender and, the generated data is recorded on the fixed disk for example in element dimension measuring unit 200, as described in relation with FIG. 14.

FIG. 22 conceptually shows a structure of the resultant measurement data transmitted from element dimension measuring unit 200 to element dimension calculating unit 100 and then recorded on fixed disk 124 in element dimension calculating unit 100 as described in connection with FIG. 15.

The resultant measurement data is generated in element dimension measuring unit 200 and includes product number specifying the mask, pattern number of a pattern to be measured, measurement value and data of measurement range for example.

FIG. 23 conceptually shows a structure of the production condition data generated in the element dimension calculating unit and recorded on fixed disk 124 for example in the element dimension calculating unit as described in connection with FIG. 16.

In element dimension calculating unit 100 and dimension accuracy database 101 provided in association with the calculating unit, data of production conditions for previously manufactured photomasks are accumulated as database. According to a production error with respect to the production conditions and the dimension of a pattern of an actually produced photomask, element dimension calculating unit 100 selects such production conditions as pattern-drawing unit, etching unit and measuring unit for producing ordered photomasks and specifies a recipe designating operating conditions of such units.

FIG. 24 conceptually shows the production error data transmitted from element dimension calculating unit 100 to order-sender computer 300 and recorded on the fixed disk for example of the order-sender computer as described in connection with FIG. 17.

As discussed above, the element dimension calculating unit 100 calculates the production error data as data of a dimension difference, between the finished dimension of a photomask pattern that is calculated based on the entire reticle and the dimension of the design pattern with a certain rounding error. Here, the finished dimension of the photomask pattern is calculated according to actual measurements of a plurality of representative points and values obtained by simulation with certain corrections made based on the actual measurements.

Such production error data is transmitted to order-sender computer 300 while actually fabricated photomasks are delivered to the order-sender. Accordingly, the order-sender sees the degree of accuracy in the finish of photomasks that the order-sender ordered. Moreover, regarding estimate of the production error of the finished dimension, all of designated patterns are actually measured or only the specified representative points are actually measured and simulation is performed for remaining patterns. Thus, the cost for measurement is reduced to cut the production cost of the photomask and accordingly products are delivered to the order-sender. Alternatively, if a further reduction of the photomask production cost is desired, the production error of all of finished patterns may be estimated through simulation only without actual measurement of representative points. The method of calculating the production error data is specified depending on the measurement method data transmitted by the order-sender to order-receiver computer 400 via order-sender computer 300.

Method of Measuring the Dimension of Representative Points and Method of Deriving a Production Error A method of measuring the dimension of representative points and a method of deriving a production error are now described.

FIGS. 25A–25D conceptually illustrate a method of calculating a production error for a mask design figure which is a pattern including its sides diagonal to lines (bars or crossbars) constituting a design grid.

Figure 25A:
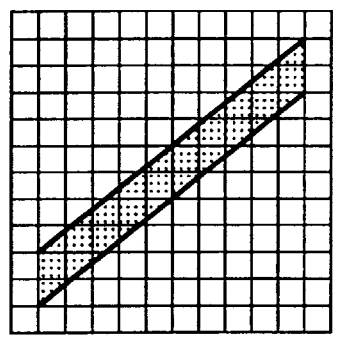
FIGS. 25A–25D conceptually illustrate a method of calculating a production error for a mask design figure which is a pattern including its sides diagonal to lines (bars or crossbars) constituting a design grid.

FIG. 25A shows an original pattern of the mask design figure.

Figure 25B:
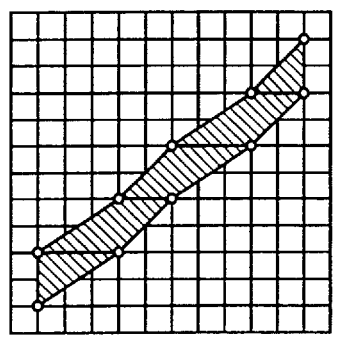

FIG. 25B illustrates a shape of the figure after rounding by an address unit in drawing the mask pattern based on the mask design figure shown in FIG. 25A.

Specifically, as shown in FIG. 25A, the mask pattern of the ideal design figure is formed by connecting lines that are not necessarily on the coordinates of the address unit (design grid). However, when such a mask design figure is actually drawn on a resist for photomask patterning, the mask design figure must be represented by a set of coordinates on the address unit of a pattern-drawing unit.

Then, as shown in FIG. 25B, the mask design figure is drawn by connecting allowable points on the address unit. Accordingly, diagonal lines are not necessarily represented by straight lines.

Figure 25C:
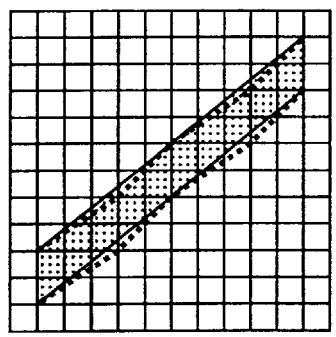

FIG. 25C shows pattern image data corresponding to an image observed in element dimension measuring unit 200. Here, if element dimension measuring unit 200 optically measures the dimension, the black circles shown in FIG. 25C correspond to observed points having at least a predetermined level of the detected light intensity. If element dimension measuring unit 200 measures the dimension by means of an electron beam, the black circles in FIG. 25C correspond to observed points having at least a predetermined level of the intensity of the electron beam that is detected.

Figure 25D:
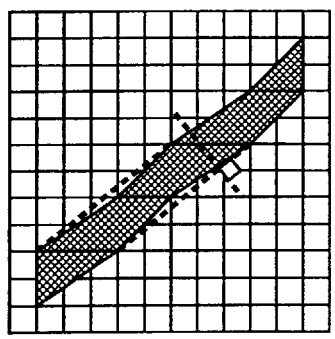

FIG. 25D shows a process of determining a production error by comparing the pattern image data with data after rounding by the address unit.

For example, the pattern data after rounding by the address unit may be compared with the pattern image data to find the maximum difference in dimension therebetween that is to be regarded as a production error. Alternatively, the polygon produced after rounding by the address unit may be compared with the pattern image data to find a difference in dimension in the vertical direction that is to be regarded as a production error.

FIGS. 26A–26D conceptually illustrate a procedure of determining a production error for a circular mask design figure.

Figure 26A:
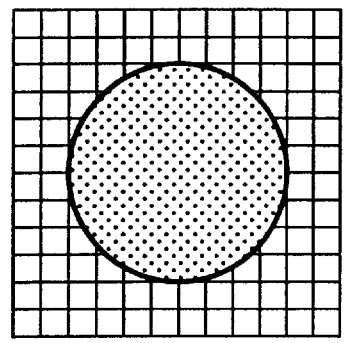
FIGS. 26A–26D conceptually illustrate a procedure of determining a production error for a mask design figure which is a circle.

As shown in FIG. 26A, the mask design figure is originally circular in shape.

The circular figure is drawn by a pattern-drawing unit in processing a photomask that uses its address unit to represent the circle as shown in FIG. 26A as a set of allowable coordinates on the address unit.

Figure 26B:
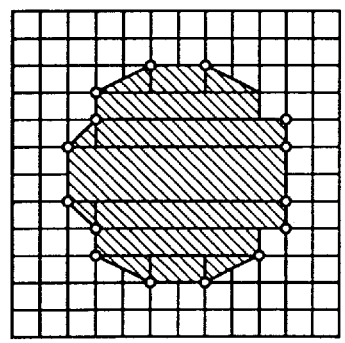

FIG. 26B shows a figure after rounding by the address unit.

Accordingly, the figure after rounding by the address unit is not a circle but a polygon.

Figure 26C:
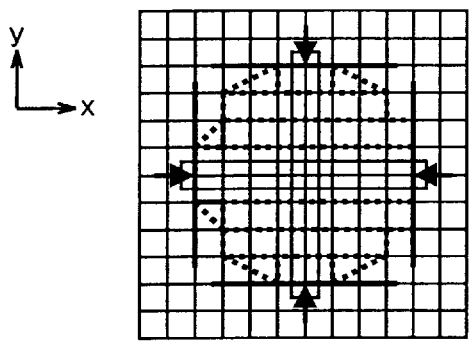

In FIG. 26C, only the data corresponding to an outline, that is a part of the pattern image data generated as shown in FIG. 25C, is shown by black circles for a better visibility of the figure.

Referring to FIG. 26C, measurement windows are specified on the pattern image data in x and y directions.

Figure 26D:
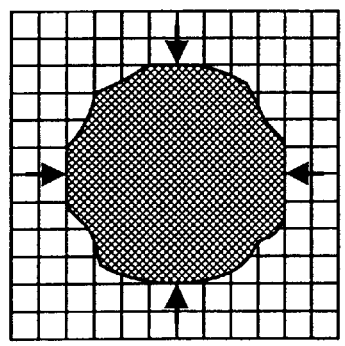

Referring to FIG. 26D, the generated pattern image data is compared with the pattern after rounding as shown in FIG. 26B to calculate a production error.

According to the description above, the design figure undergoes rounding for adapting to the address unit of the pattern-drawing unit in producing the photomask, and the resultant figure after rounding is a polygon which is different from the original design data.

However, the above-described correction by the optical proximity effect could not provide a satisfactory measurement accuracy even if the mask design figure itself is represented by a set of coordinates on the address unit only.

FIGS. 27A–27D conceptually illustrate a method of measuring the dimension of a mask pattern corrected by such optical proximity effect.

Figure 27A:
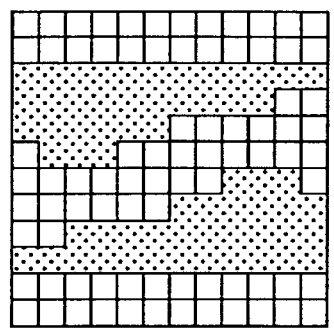
FIGS. 27A–27D conceptually illustrate a method of measuring the dimension of a mask pattern corrected by optical proximity effect.

Specifically, FIG. 27A shows a mask design figure having its shape resultant from correction by the optical proximity effect.

Figure 27B:
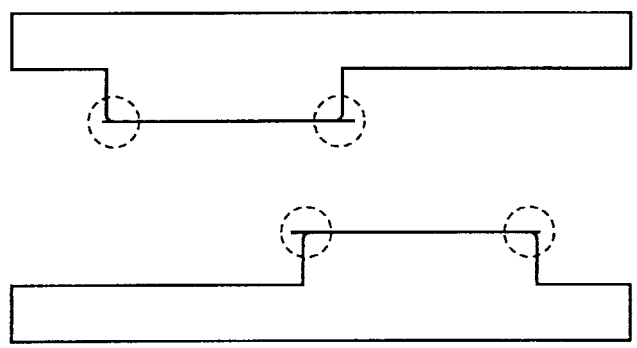

It is noted that the figure in FIG. 27A is simplified as shown in FIG. 27B for simplifying description thereof.

If the possible shape of a measurement window is rectangle only, measurements must be taken in a rectangular region only. In other words, the measurement window can be defined in a region where opposing sides are parallel with each other with a certain distance therebetween.

However, when representative points are to be measured, such a rectangular measurement window may not enough in size to achieve a satisfactory measurement accuracy.

Even if a production error is determined through simulation, the region based on which the error is determined is a limited one, which could result in a value insufficient accuracy.

Figure 27C:
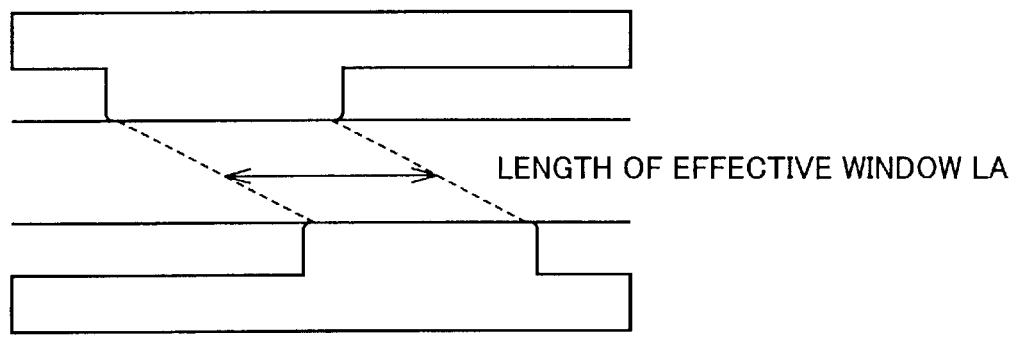

Then, for such a figure, as shown in FIG. 27B, two parallel sides and ends thereof are extracted first. Next, as shown in FIG. 27C, for fitting of outer lines, least-squares approximation is performed to make the two sides parallel with each other. After this, a measurement window is defined as a parallelogram region including the two sides, for example. In this case, an effective window width LA is larger than that of the rectangular measurement window.

Figure 27D:
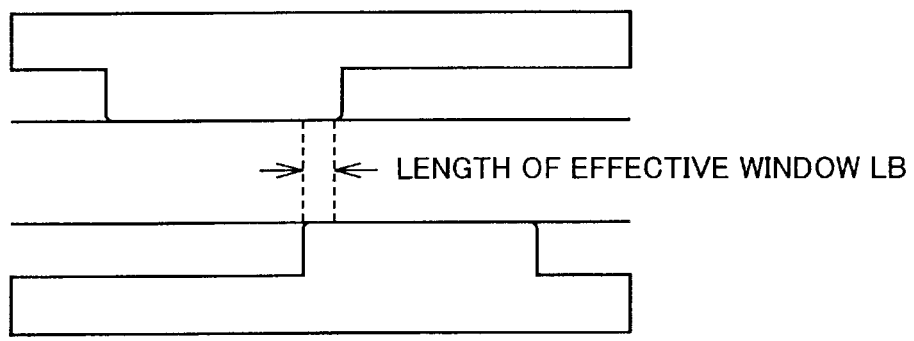

FIG. 27D shows an effective window width LB of the rectangular measurement window.

Figure 28:
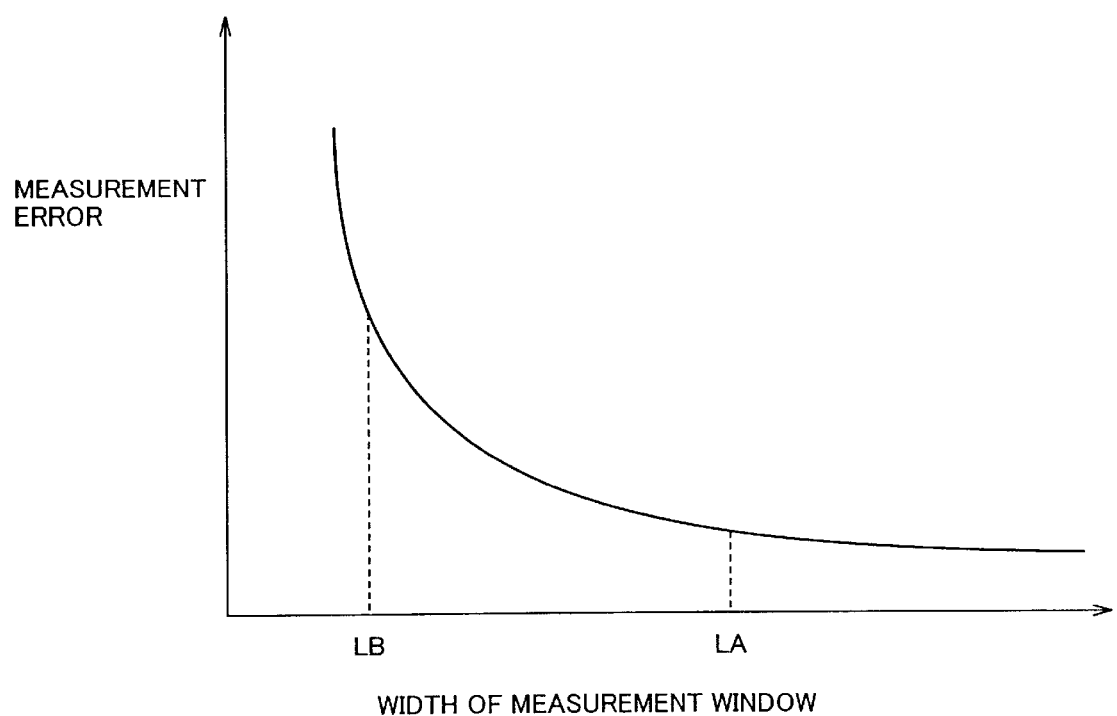
FIG. 28 shows a relation between the width of a measurement window and measurement error.

FIG. 28 shows a relation between the width of the measurement window and measurement error.

Accordingly, an increased accuracy of measurement is achieved by the increased effective window width LA as shown in FIG. 27C as compared with the effective window width LB in FIG. 27D.

Although the measurement window described above is parallelogram, the measurement window may not necessarily be parallelogram but may be trapezoid, for example.

In this way, measurements are taken by firstly extracting, from the design figure, ends of a pattern by means of the address unit, and connecting the ends to find a pair of sides of the pattern that are parallel with each other. Then, the measurement window is defined to include the parallel sides.

The measurement window is then adjusted to exclude the ends of the sides while least-squares approximation is performed on the straight lines to determine the distance between the sides. Here, the fact that the sides are parallel is known in advance from the design data. Then, under the condition that the sides are parallel, the least-squares approximation is performed on the straight lines to extract the sides. For data within the measurement window, a tolerance is determined between the figure of the pattern image data and the figure drawn from the mask design data to obtain production error data.

The process described above is carried out for the inside of the defined measurement window fixed on an object to be measured.

Depending on the structure of element dimension measuring unit 200, the resolution of data from which the pattern image data is generated may correspond to each unit of the grid.

In this case, the measurement window is moved relative to an object to be measured, or the object to be measured is moved relative to the fixed measurement window, in order to more accurately detect any edge of the object to be measured.

FIGS. 29A–29D conceptually illustrate a method of measuring the dimension by moving an object to be measured and a detector of a measuring unit in parallel with each other.

Detection of edges and a measurement method for determining actual measurements of representative points are described below.

Figure 29A:
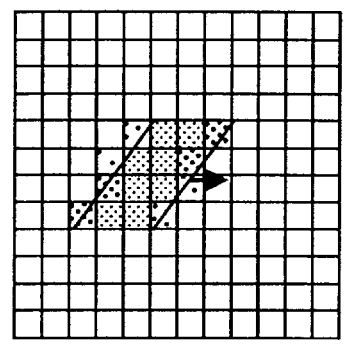
FIGS. 29A–29D conceptually illustrate a method of measuring dimensions by moving an object to be measured and a detector of a measuring unit in parallel with each other.

FIG. 29A shows data of a pattern from which data corresponding to a grid is obtained by a measuring unit which optically obtains image data of an object to be measured, for example.

For example, the optical measuring unit uses a CCD (charge-coupled device) to convert the light intensity of reflected or transmitted light into an electric signal for a predetermined grid region. For each unit of the grid, the light intensity is measured by the CCD, and this measurement is performed for the entire region of a measurement window. Thus, data on a distribution of the light intensity on the units of the grid is obtained.

In the grid shown in FIG. 29A, a unit of a higher light intensity is represented by black circles of higher density while a unit of a lower light intensity is represented by black circles of lower density depending on the intensity.

It is supposed that data of the light intensity is obtained nearly on the grid. As discussed above, data of the pattern is of multiple tones.

Then, a measurement window or an object to be measured itself is shifted slightly from the on-grid position to obtain an optical intensity image.

Moreover, the measurement window or the object to be measured is shifted to obtain a distribution of the light intensity. Such an intensity distribution is obtained by shifting the window or object over several units of the grid.

The amount of shift is adjusted according to the accuracy of movement of the field of view of the measuring unit.

Figure 29B:
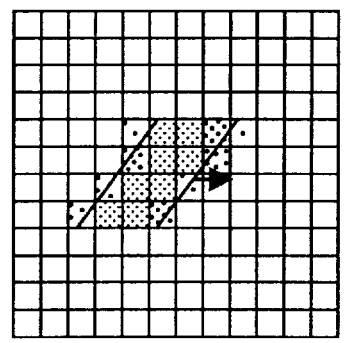
Figure 29C:
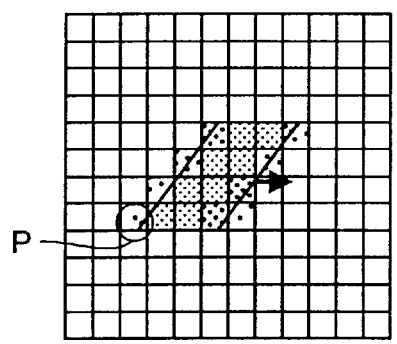
Figure 29D:
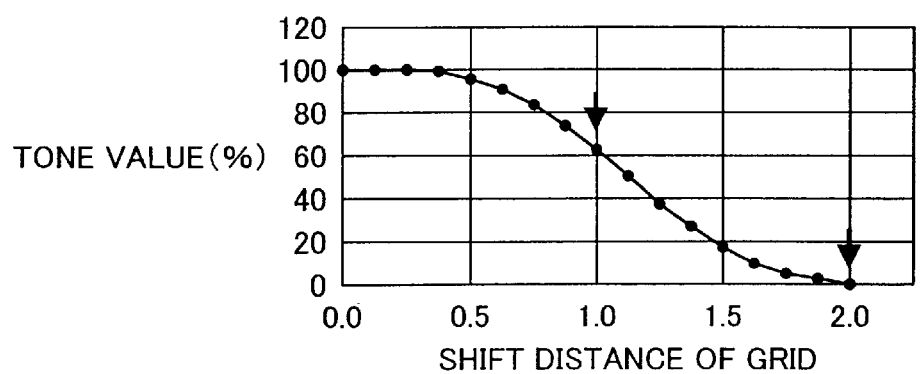
Figure 30:
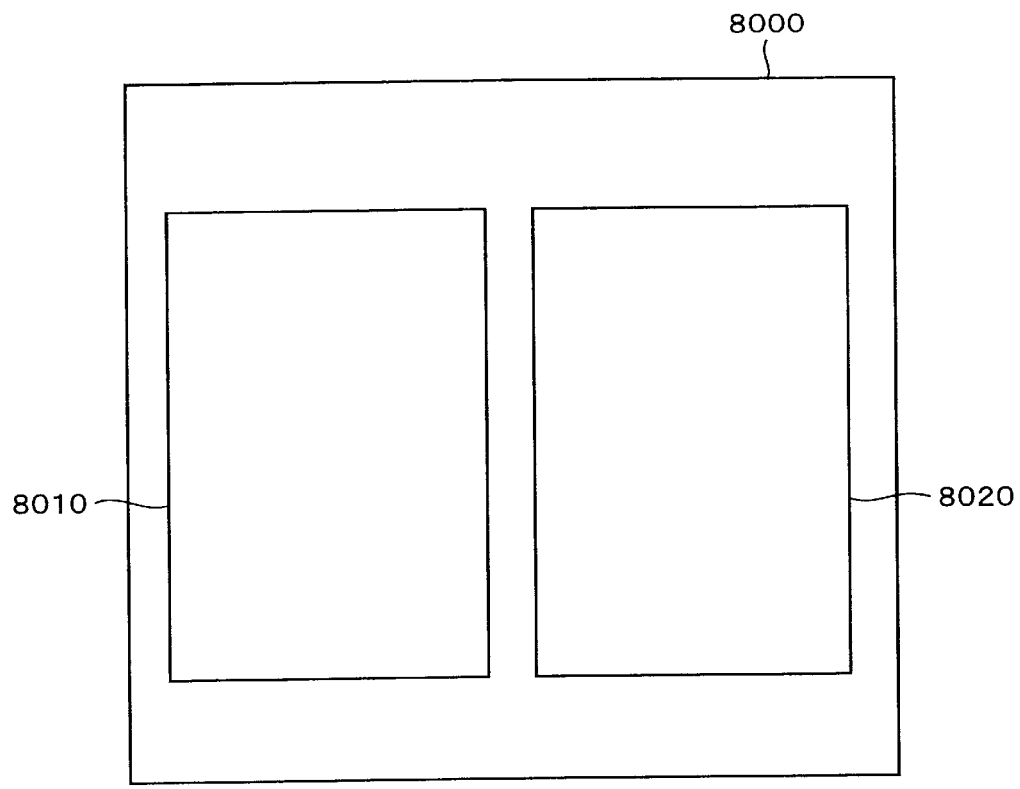
FIG. 30 shows a reticle 8000 for an optical stepper.
Figure 31A:
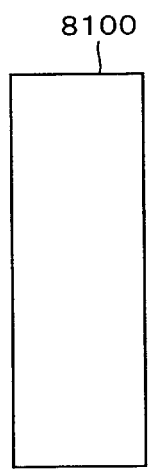
FIGS. 31A and 31B show an element pattern 8100 and how the dimension of the element pattern 8100 is measured.
Figure 31B:
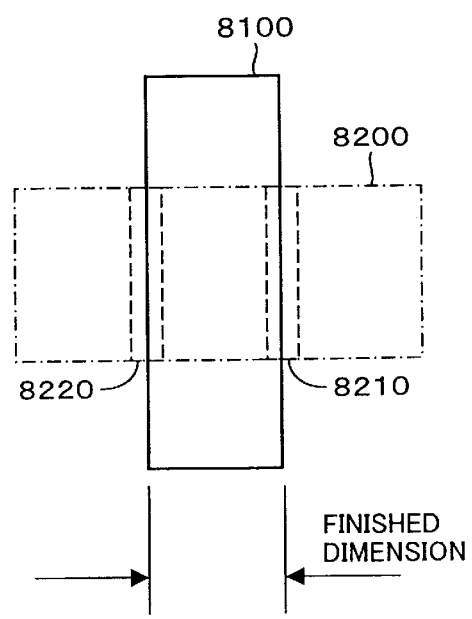

As shown in FIGS. 29A–29C, the window or object is shifted by one unit of the grid. Here, for data of one grid unit represented by a circle indicated by P in FIG. 29C, FIG. 29D shows, by the horizontal axis, the distance by which the grid is shifted (shift distance of grid) and shows the tone level by the vertical axis.

When the distance of shift reaches a certain value or more, no object to be measured is present in the grid unit and thus the tone value is 0. For example, suppose that a pattern according to mask design data is located on the grid with the tone value of 60%. Then, the object to be measured is considered to be present on the grid when the tone value is 60% or 0%.

Accordingly, a point of the object that is located on the grid is determined for one of the sides as described above. For the other side, the point on the grid is determined in a similar manner. Then even if the optical intensity is obtained with respect to the grid, the dimension can be estimated with a higher accuracy than that of the grid.

According to the photomask supply system as described above, any production error of photomasks is derived through calculation based on specification data, so that the production period of photomasks is reduced. Moreover, the production cost is also reduced since the time for measurement that is derived through calculation is used in presenting estimate data to the order-sender.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photomask supply system supplying a photomask to an order-sender, comprising:
    a communication unit for communicating with said order-sender;
    a storage unit for storing data;
    a measuring unit for measuring, according to a measurement recipe, the dimension of a pattern on said photomask which has been produced; and
    a control unit connected to said communication unit and said storage unit for controlling said communication unit and said storage unit,
    said control unit including
        means for receiving specification data via said communication unit and storing said specification data in said storage unit, said specification data including a dimension-measurement method and mask design data for the pattern formed on said photomask,
        recipe generating means for generating said measurement recipe according to said dimension-measurement method and said mask design data,
        means for receiving from said measuring unit measurement data obtained from actual measurement performed by said measuring unit,
        calculating means for calculating to derive, based on said measurement data and said mask design data, production error data for said pattern, and
        means for transmitting said production error data to said order-sender via said communication unit.

2. The photomask supply system according to claim 1, wherein
    said control unit further includes
        time calculating means for calculating a measurement time required for measurement performed by said measuring unit based on said specification data;
        estimate calculating means for calculating cost estimate data based on said measurement time, and
        transmitting means for transmitting said cost estimate data to said order-sender via said communication unit.

3. The photomask supply system according to claim 1, wherein
    said storage unit stores production condition data of said photomask,
    said calculating means updates and accumulates in said storage unit, said production error data relating to the production condition data of said photomask and to a structure and a design dimension of said mask design data, and determines through simulation said production error with respect to said mask design data supplied from said order-sender.

4. The photomask supply system according to claim 1, wherein
    said recipe generating means includes position calculating means for calculating points to be measured based on said mask design data, said points to be measured including a shape and a design dimension of a pattern to be measured as well as the position of said pattern on said photomask.

5. The photomask supply system according to claim 1, wherein
    said recipe generating means includes data generating means for generating said measurement recipe including a controlled range for measurement as well as a controlled number of times the measurement is repeated.

6. The photomask supply system according to claim 2, wherein
    said estimate calculating means includes
        list calculating means for calculating a selection list including a plurality of sets of said dimension-measurement method, said production error and said cost estimate data that are associated with each other according to order details from said order-sender, and
        means for transmitting said selection list to said order-sender via said communication unit.

* * * * *